(12) United States Patent
Kusuda

(10) Patent No.: US 11,830,670 B2
(45) Date of Patent: Nov. 28, 2023

(54) COILED ELECTRONIC COMPONENT

(71) Applicant: Nidec-Read Corporation, Kyoto (JP)

(72) Inventor: Tatsufumi Kusuda, Kyoto (JP)

(73) Assignee: Nidec-Read Corporation, Kyoto (JP)

( * ) Notice: Subject to any disclaimer, the term of this patent is extended or adjusted under 35 U.S.C. 154(b) by 0 days.

(21) Appl. No.: 17/985,134

(22) Filed: Nov. 10, 2022

(65) Prior Publication Data

US 2023/0068243 A1 Mar. 2, 2023

Related U.S. Application Data

(62) Division of application No. 16/488,242, filed as application No. PCT/JP2018/005562 on Feb. 16, 2018, now Pat. No. 11,527,341.

(30) Foreign Application Priority Data

| Feb. 28, 2017 | (JP) | 2017-035642 |
| Feb. 28, 2017 | (JP) | 2017-036354 |
| Feb. 28, 2017 | (JP) | 2017-037481 |

(51) Int. Cl.
| H01F 5/00 | (2006.01) |
| H01F 19/00 | (2006.01) |
| H01F 17/02 | (2006.01) |
| H01F 27/29 | (2006.01) |
| H01F 30/16 | (2006.01) |
| H01F 41/04 | (2006.01) |
| H03H 7/075 | (2006.01) |

(52) U.S. Cl.
CPC ............. *H01F 5/00* (2013.01); *H01F 17/02* (2013.01); *H01F 27/29* (2013.01); *H01F 30/16* (2013.01); *H01F 41/04* (2013.01); *H03H 7/075* (2013.01); *H01F 2005/006* (2013.01)

(58) Field of Classification Search
None
See application file for complete search history.

(56) References Cited

U.S. PATENT DOCUMENTS

| 5,428,337 A * | 6/1995 | Vinclarelli | H01F 41/071 336/83 |
| 8,749,992 B2 * | 6/2014 | Konz | H01H 50/12 336/205 |

OTHER PUBLICATIONS

Kusuda, "Coiled Electronic Component, Coil Component, Manufacturing Method of Coil Component, Inductance Element, T-Type Filter, Oscillation Circuit, and Manufacturing Method of Inductance Element", U.S. Appl. No. 16/488,242, filed Aug. 22, 2019.

* cited by examiner

*Primary Examiner* — Kenneth B Wells
(74) *Attorney, Agent, or Firm* — JCIPRNET

(57) ABSTRACT

A coiled electronic component includes: an electronic component body which includes a coil portion having a spiral structure and formed of an electrically conductive material, and electrically conductive connection portions arranged on both ends of the coil portion; and a pair of electrodes for respectively connecting the electrically conductive connection portions to assembly portions arranged on an assembly object. The electrode includes a pair of pinching pieces for pinching the electrically conductive connection portion, and the pair of pinching pieces is opened in a manner that the electrically conductive connection portion is received and fitted therebetween.

6 Claims, 19 Drawing Sheets

COILED ELECTRONIC COMPONENT

CROSS-REFERENCE TO RELATED APPLICATION

This application is a Divisional Application of and claims the priority benefit of U.S. Pat. No. 11,527,341, filed on Aug. 22, 2019, now granted. The prior U.S. Pat. No. 11,527,341 is a 371 application of the international PCT application serial no. PCT/JP2018/005562, filed on Feb. 16, 2018, which claims the priority benefits of Japan Patent Application No. 2017-035642, filed on Feb. 28, 2017, Japan Patent Application No. 2017-036354, filed on Feb. 28, 2017, and Japan Patent Application No. 2017-037481, filed on Feb. 28, 2017. The entirety of each of the above-mentioned patent applications is hereby incorporated by reference herein and made a part of this specification.

BACKGROUND OF THE INVENTION

Technical Field

The present invention relates to a coiled electronic component assembled to an assembly object consisting of a substrate and the like, a coil component, a manufacturing method of the coil component, an inductance element, a T-type filter, an oscillation circuit, and a manufacturing method of the inductance element.

Related Art

In recent years, an electronic component used in a vehicle communication device and the like becomes more and more miniaturized along with improvement of the function thereof. As a method for manufacturing this extremely small electronic component, the following manufacturing method is known in which plural pieces of ceramic plates (glass layers) on which ring-like copper wiring patterns are formed are laminated, external electrodes are formed on both ends of a laminate consisting of the ceramic plates, and conductor portions of each ceramic plate are connected to each other by the external electrodes (for example, see patent literature 1).

LITERATURE OF RELATED ART

Patent Literature

Patent literature 1: Japanese Laid-Open No. 2015-23714

SUMMARY

However, in the above-described manufacturing method, it is necessary to position the plural pieces of ceramic plates with extremely high accuracy. Therefore, a conduction failure that the respective ring-like patterns are not conducted is inevitably generated when the positioning deviates. In addition, in chip coils produced by this manufacturing method, it is necessary to laminate the ceramic plates to the number of coil turns, and connection portions between through holes and the ring-like patterns are formed to this number. Therefore, there is an inconvenience that a contact failure is easily generated between the ring-like patterns, the manufacturing cost is high, or the like.

An object of the present invention is to provide a coiled electronic component in which generation of a contact failure in an electronic component is easily suppressed and the manufacturing cost thereof is kept low.

The coiled electronic component according to one aspect of the present invention includes: an electronic component body which has a coil portion having a spiral structure and formed of an electrically conductive material, and electrically conductive connection portions arranged on both ends of the coil portion; and a pair of electrodes for respectively connecting the electrically conductive connection portions to assembly portions arranged on an assembly object; wherein the electrode includes a pair of pinching pieces for pinching the electrically conductive connection portion, and the pair of pinching pieces is opened in a manner that the electrically conductive connection portion is received and fitted therebetween.

In addition, the coiled electronic component according to one aspect of the present invention includes: a coil portion having a spiral structure and formed of an electrically conductive material, and electrically conductive connection portions arranged on both ends of the coil portion; and opening portions corresponding to positioning fixed portions arranged on an assembly object are formed in the electrically conductive connection portions.

A coil component according to one aspect of the present invention includes: an electronic component body including a coil portion having a spiral structure and formed of a material having electrical conductivity; an accommodation case consisting of an electrically non-conductive material and accommodating the electronic component body; and a pair of electrodes connected to both ends of the electronic component body; wherein the pair of electrodes are respectively arranged on both ends of the accommodation case.

A manufacturing method of coil component according to one aspect of the present invention includes: (a) a fabrication process of an electronic component body for fabricating the electronic component body which includes a coil portion having a spiral structure and formed of a material having electrical conductivity; (b) a fabrication process of an accommodation case for fabricating the accommodation case which consists of an electrically non-conductive material and accommodates the electronic component body; (c) an arrangement process of electrodes for respectively arranging the electrodes on both ends of the electronic component body; and (d) a connection process of the electronic component body and the electrodes for respectively bringing both ends of the electronic component body into contact with the electrodes for a connection.

An inductance element according to one aspect of the present invention includes: a coil portion which is disposed to constitute a multi-spiral in which a plurality of coils are spaced apart from each other; and a conductive coupling portion which couples and conducts the plurality of coils at one end of the multi-spiral.

In addition, a T-type filter according to one aspect of the present invention includes the above-described inductance element and a capacitor; the number of the coils is two; one terminal of the capacitor is connected to the conductive coupling portion and thereby the two coils are connected in series, and the one terminal of the capacitor is connected to a connection point of the two coils.

In addition, an oscillation circuit according to one aspect of the present invention includes the above-described inductance element and a capacitor; one terminal of the capacitor is connected to one of the plurality of coils, and the other terminal of the capacitor is connected to the conductive coupling portion or a position that is spaced apart by a prescribed distance from a connection place of the one terminal in the one coil.

In addition, a manufacturing method of inductance element according to one aspect of the present invention is a manufacturing method of the above-described inductance; along a peripheral surface of an electrically conductive tubular body, a plurality of spiral slits which are spaced apart from each other are formed in a region between one end of the tubular body and a prescribed position spaced apart by a prescribed length from the other end of the tubular body toward the one end direction, and thereby the plurality of spiral coils are formed in the above region and set as the coil portion, and a region from the other end to the prescribed position is set as the conductive coupling portion.

DESCRIPTION OF THE EMBODIMENTS

Figure 1:
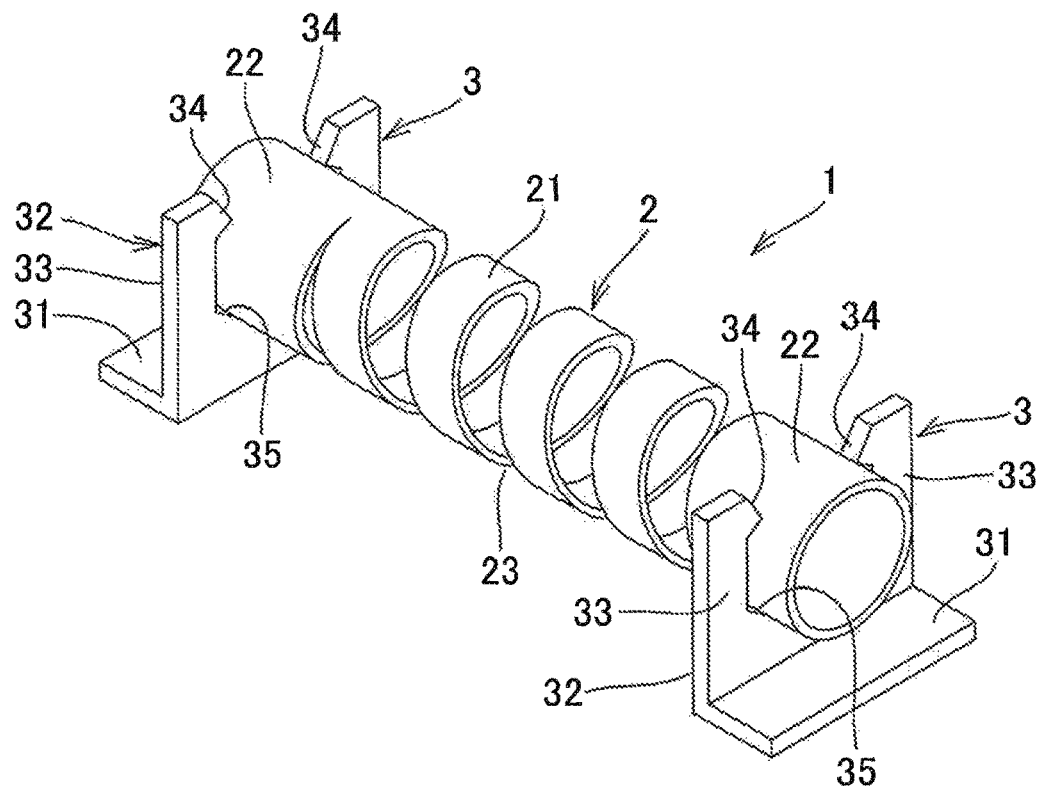
FIG. 1 is a perspective view showing a first embodiment of a coiled electronic component according to one aspect of the present invention.

Embodiments of a coiled electronic component 1 according to one aspect of the present invention are described below based on the diagrams. Besides, components denoted by the same reference numeral in each diagram have the same configuration, and specific description thereof is omitted.

First Embodiment

Figure 2:
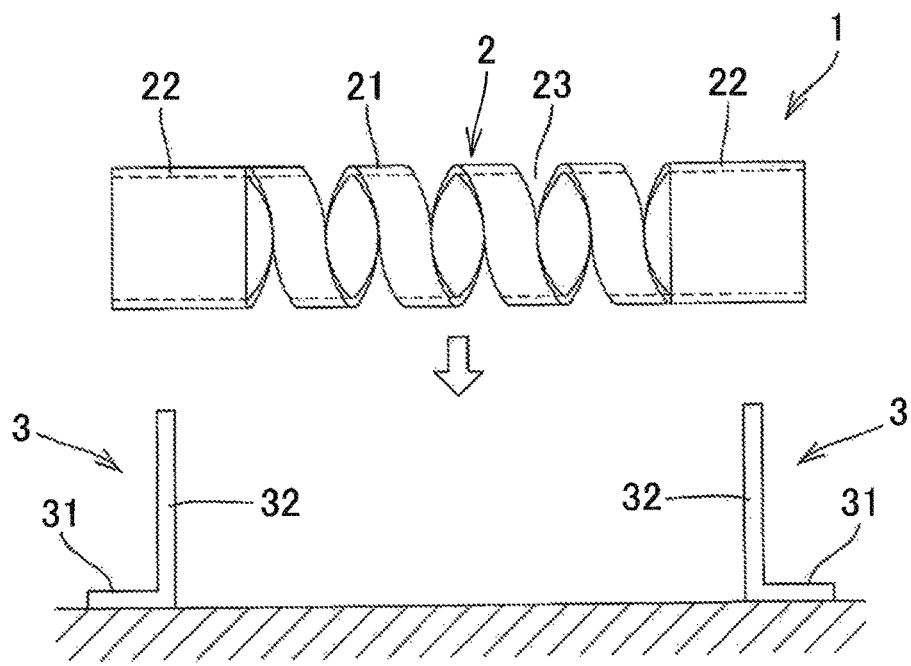
FIG. 2 is a front view showing a disassembled state of the coiled electronic component.
Figure 3:
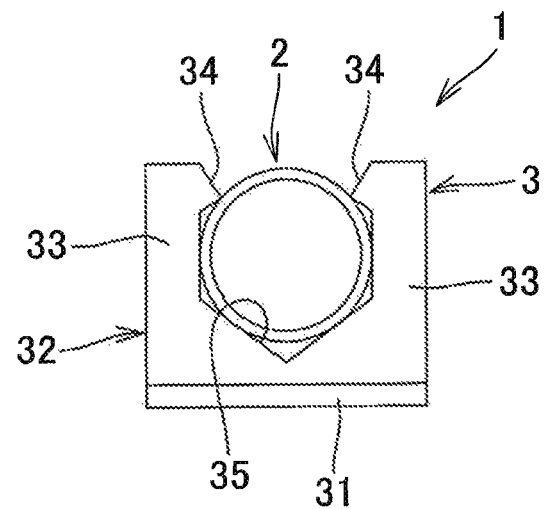
FIG. 3 is a side view showing a specific structure of the coiled electronic component.
Figure 4:
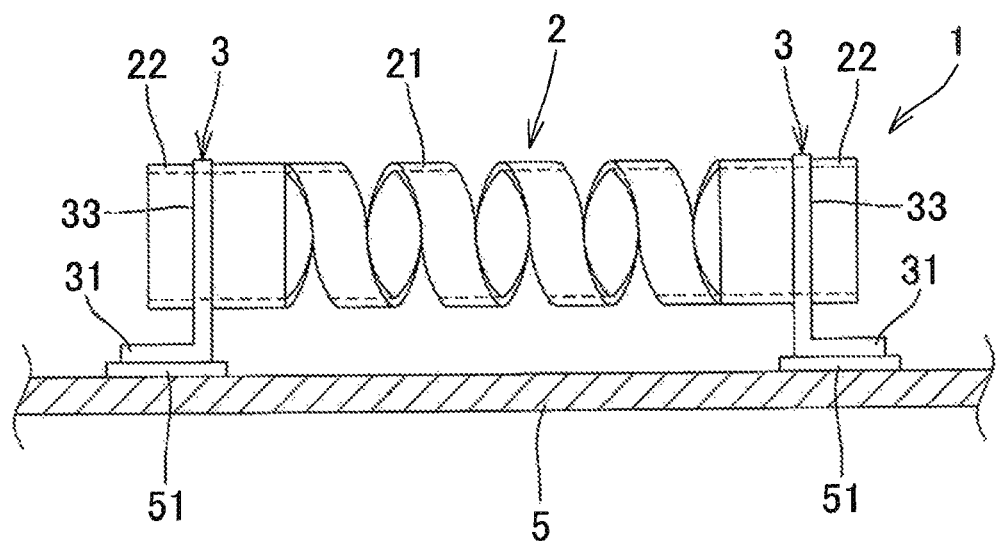
FIG. 4 is a front view showing a state in which the coiled electronic component is assembled to an assembly object.

FIG. 1 is a perspective view showing the coiled electronic component 1 of a first embodiment of the present invention; FIG. 2 is a front view showing a state in which an electronic component body 2 and electrode plates 3, 3 (electrodes) constituting the coiled electronic component 1 are disassembled; FIG. 3 is a side view showing a specific structure of the coiled electronic component 1; and FIG. 4 is a front view showing a state in which the coiled electronic component 1 is assembled to an assembly object 5 consisting of a substrate and the like.

The coiled electronic component 1 includes: the electronic component body 2 consisting of a material of nickel or nickel alloy having electrical conductivity, and a pair of electrode plates 3, 3 for connecting both ends of the electronic component body 2 to assembly portions consisting of electrode pads 51, 51 arranged on an assembly object.

The electronic component body 2 consists of a tubular body having a diameter (an outer diameter) of about 50 µm-500 µm. A coil portion 21 having a spiral structure is formed in a central portion of the electronic component body 2 by, for example, a length of about 0.5-1.0 mm, and cylindrical electrically conductive connection portions 22 are respectively arranged on both ends of the electronic component body 2. Besides, the electronic component body 2 may have a structure in which a plating layer such as a gold plating or the like is arranged on an inner peripheral surface of the electronic component body 2, and an insulating coating layer is arranged on an outer peripheral portion of the electronic component body 2.

As a fabrication method of the electronic component body 2, for example, the following method or the like is adopted in which after a tubular body consisting of a material having electrical conductivity is formed, slits 23 which extend spirally from one end toward the other end of the tubular body is formed along a peripheral surface of the tubular body, and thereby the coil portion 21 having a spiral structure partitioned via the slits 23 is formed in a prescribed region of the electronic component body 2.

In addition, as long as an etching method, a formative processing method using a laser processing machine or the like is adopted as a forming method of the slits 23, the coil portion 21 can be easily and properly fabricated in the extremely small electronic component body 2 as described below, and the mass production of the electronic component body 2 can be achieved.

For example, by setting a total length of the coil portion 21 arranged in the electronic component body 2 to 0.5 mm-1.0 mm and a diameter of the coil portion 21 to 50 μm-500 μm, and appropriately selecting the number of turns of the coil portion 21, an inductance element having an inductance of about 30 pH-100 pH can be easily and properly fabricated.

Besides, instead of the embodiment in which the slits 23 are formed after the tubular body is formed, the coil portion 21 and the slits 23 may be fabricated at the same time by electroforming or a fabrication method using a three-dimensional metal printer. In addition, the cross-sectional shape of the electronic component body 2 is not limited to the circular shape and may be various shapes such as a square shape, a hexagon shape or the like.

The electrode plate 3 has a joint portion 31 which is joined to the electrode pad 51 arranged on the assembly portion of the assembly object 5 by soldering or the like and a standing position 32 which stands from one end of the joint portion 31, and the electrode plate 3 is formed, for example, by performing a folding process and the like on a plate material consisting of a material having electrical conductivity such as copper, nickel, silver or the like. Besides, the plate-shaped electrode plate 3 is shown as an example of the electrode, but the electrode is not necessarily limited to the plate shape or the electrode obtained by processing a plate-shaped member.

The standing position 32 has a pair of pinching pieces 33, 33 for pinching the electrically conductive connection portion 22 of the electronic component body 2, the pair of pinching pieces 33, 33 are opened in a manner that the electrically conductive connection portion 22 is received and fitted therebetween, and the electrically conductive connection portion 22 of the electronic component body 2 is fitted to be pinched between the two pinching pieces 33, 33. Specifically, a separation distance of the inside surfaces of the two pinching pieces 33, 33 is set to a value substantially the same as or slightly smaller than the outer diameter of the electronic component body 2. Accordingly, when the electrically conductive connection portion 22 of the electronic component body 2 is fitted between the two pinching pieces 33, 33, the electrically conductive connection portion 22 of the electronic component body 2 is pinched in a state that the inside surfaces of the two pinching pieces 33, 33 are pressed against the peripheral surface of the electrically conductive connection portion 22.

In addition, on the upper part of the pinching piece 33, in other words, on the upstream side in the fitting direction of the electrically conductive connection portion 22, a triangular projection portion 34 projecting inward is arranged. By pressing the electrically conductive connection portion 22 of the electronic component body 2 to the upper surface of the projection portion 34 to make the two pinching pieces 33, 33 deform elastically, the electrically conductive connection portion 22 can be smoothly fitted downward of the projection portion 34 (the downstream side in the fitting direction). Then, after the electrically conductive connection portion 22 is fitted, an upward movement of the electrically conductive connection portion 22 is restricted by the projection portion 34 of the pinching piece 33, and the electrically conductive connection portion 22 is prevented from falling off.

Furthermore, a V-shaped concave portion 35 having a pair of inclined surfaces is formed in the standing position 32 of the electrode plate 3. Then, an interval between the projection portion 34 and the concave portion 35 is set so that the lower surface of the projection portion 34 and the inclined surfaces of the concave portion 35 are respectively pressed against the peripheral surface of the electrically conductive connection portion 22 when the electrically conductive connection portion 22 of the electronic component body 2 is fitted downward of the projection portion 34.

In order to assemble the coiled electronic component 1 having the above configuration to the assembly object 5 which includes a printed wiring board, a flexible board, a ceramic multilayer wiring board, an electrode plate for liquid-crystal display or plasma display, a semiconductor substrate and the like, firstly as shown in FIG. 4, the electrode plates 3, 3 are mounted on the assembly object 5, and the assembly portions consisting of the pair of electrode pads 51, 51 arranged on the assembly object 5 and the joint portions 31, 31 of the electrode plates 3, 3 are connected by a solder or the like.

Next, the electrically conductive connection portion 22 of the electronic component body 2 is fitted and held between the two pinching pieces 33, 33 arranged in the standing position 32 of the electrode plate 3. In this way, the electronic component body 2 which has the coil portion 21 having a spiral structure is connected to the electrode pads 51, 51 of the assembly object 5 via the electrode plates 3, 3, and thereby the coiled electronic component 1 which is used as an inductance element, a T-type filter, an oscillation circuit or the like can be obtained.

As described above, the coiled electronic component 1 according to one aspect of the present invention includes: an electronic component body 2 which has a coil portion 21 having a spiral structure and formed of an electrically conductive material, and electrically conductive connection portions 22, 22 arranged on both ends of the coil portion 21; and a pair of electrodes 3,3 for respectively connecting the electrically conductive connection portions 22, 22 of the electronic component body 2 to assembly portions arranged on an assembly object 5; the electrode 3 includes a pair of pinching pieces 33, 33 for pinching the electrically conductive connection portion 22 of the electronic component body 2, and the pair of pinching pieces 33, 33 are opened in a manner that the electrically conductive connection portion 22 is received and fitted therebetween. As a result, there is an advantage that generation of a contact failure in the coiled electronic component 1 can be suppressed and the manufacturing cost can be kept low even when an extremely small coiled electronic component 1 is formed.

That is, by fitting the electrically conductive connection portions 22 arranged on both ends of the electronic component body 2 between the pinching pieces 33, 33 of the electrode plates 3, the inside surfaces of the pinching pieces 33 can be respectively brought into contact with and connected to the peripheral surfaces of the cylindrical electrically conductive connection portions 22. Therefore, as for the coiled electronic component 1, compared with a case that, as shown in the conventional technology shown in patent literature 1, plural pieces of thin ceramic plates including circular conductor portions are laminated and the conductor portions of each ceramic plate are connected to each other by external electrodes formed on both ends of a chip coil body consisting of a laminate of the ceramic plates, there is little concern that a contact failure of the conductor portions is generated frequently, and the coiled electronic component 1 can be formed in an extremely simple way.

In addition, as shown in the first embodiment, in a case of the structure in which the triangular projection portion 34 projecting inward is arranged on the upstream side in the fitting direction of the electrically conductive connection portion 22 located on the upper part of the pinching piece 33, by pressing the electrically conductive connection portion 22 of the electronic component body 2 to the upper surface of the projection portion 34 to make the two pinching pieces 33, 33 deform elastically, the electrically conductive connection portion 22 can be smoothly fitted downward of the projection portion 34.

Moreover, there is an advantage that the upward movement of the electrically conductive connection portion 22 is restricted by the projection portion 34 of the pinching piece 33 in a state that the electrically conductive connection portion 22 is fitted downward of the projection portion 34 and pinched by the two pinching pieces 33, 33, and the falling off of the electrically conductive connection portion 22 can be effectively prevented. Besides, the shape of the projection portion 34 is not limited to the triangle shape and can be changed into various shapes such as an arc shape, a trapezoidal shape or the like.

Furthermore, as shown in the first embodiment, in a case that the V-shaped concave portion 35 having a pair of inclined surfaces is formed in the standing position 32 of the electrode plate 3, and an interval between the projection portion 34 and the concave portion 35 is set so that the inclined surface of the concave portion 35 and the lower surface of the projection portion 34 are respectively pressed against the peripheral surface of the electrically conductive connection portion 22, there is an advantage that the electrically conductive connection portion 22 and the electrode plate 3 can be connected more reliably.

Figure 5:
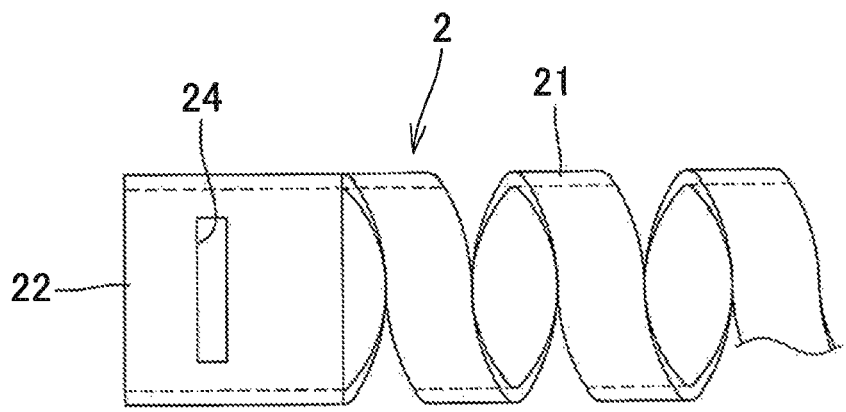
FIG. 5 is a front view of a variant of an electrically conductive connection portion arranged on an end of an electronic component body.
Figure 6:
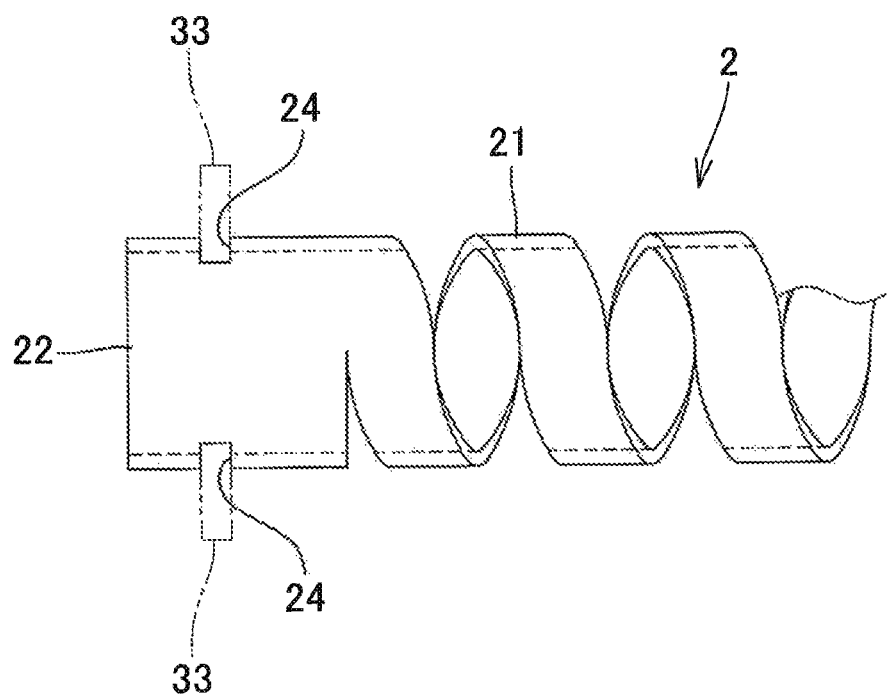
FIG. 6 is a plan view showing a specific structure of the electrically conductive connection portion.

FIG. 5 and FIG. 6 are a front view and a plan view showing a variant of the electrically conductive connection portion 22 which is arranged on both ends of the electronic component body 2.

On the peripheral surface of the electrically conductive connection portion 22 of the variant, a pair of slits 24, 24 into which inner edge portions of the pinching pieces 33, 33 of the electrode plate 3 are inserted are formed. According to this configuration, in a state that the inner edge portions of the pinching pieces 33, 33 and the slits 24, 24 are engaged, the electrically conductive connection portion 22 can slide and displace downward along the inner edge portions of the pinching pieces 33, 33 and thereby move smoothly to the pinching position.

Then, by engaging the inner edge portion of the pinching piece 33 and the slit 24, the connection state of the electrically conductive connection portion 22 and the electrode plate 3 can be stably maintained. Moreover, there is an advantage that the movement in a longitudinal direction (a direction along the axial direction) of the electronic component body 2 can be restricted by the pinching pieces 33, 33, and thus the electronic component body 2 can be reliably prevented from falling off from the electrode plates 3, 3. Besides, by arranging, instead of the slits 24, 24, concave portions which are concave inward on the peripheral surface of the electrically conductive connection portions 22, a similar effect can also be obtained.

Figure 7:
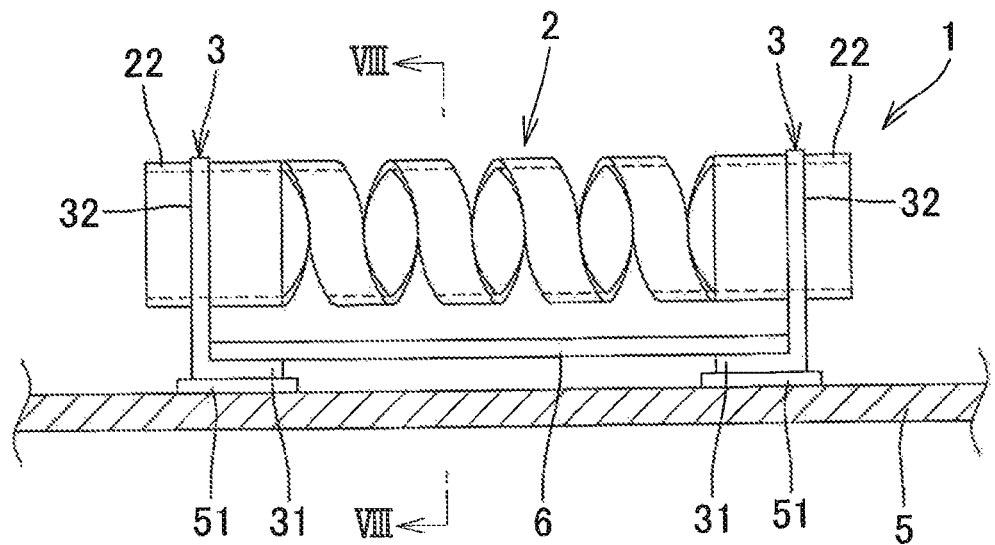
FIG. 7 is a front view showing a variant of the coiled electronic component of the first embodiment.
Figure 8:
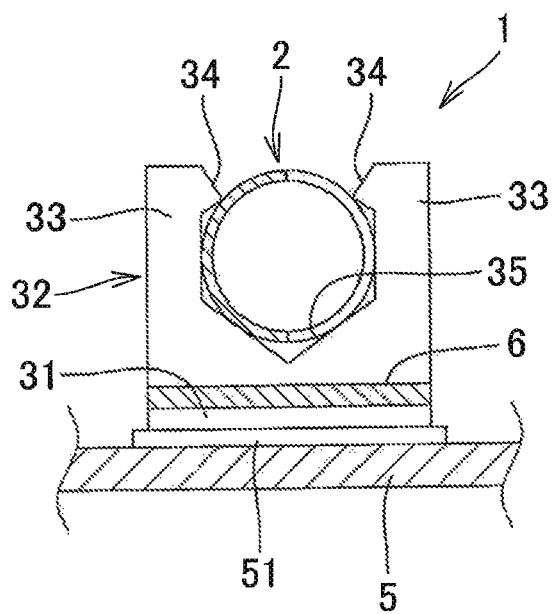
FIG. 8 is a cross-section view along a VIII-VIII line of FIG. 7 showing a configuration of the coiled electronic component.

FIG. 7 and FIG. 8 are a front view and a side view of a variant of the coiled electronic component 1. The coiled electronic component 1 includes a coupling member 6 which includes an electrically non-conductive member consisting of a plastic material, a ceramic material or the like. The coupling member 6 couples the left electrode plate 3 and the right electrode plate 3 with each other by the upper surfaces of the joint portions 31 of the electrode plates 3 being adhered to the lower surfaces of both ends of the coupling member 6.

According to this configuration, by respectively fitting the electrically conductive connection portions 22 arranged on both ends of the electronic component body 2 between the pinching pieces 33, 33 of the two electrode plates 3, 3 which are coupled by the coupling member 6, and holding the electrically conductive connection portion 22 of the electronic component body 2 between the projection portion 34 and the concave portion 35 of the electrode plate 3, a chip-type electronic component can be obtained in which the electronic component body 2, the electrode plates 3, 3, and the coupling member 6 are integrated. Therefore, work of mounting the electrode plates 3, 3 on the assembly object 5 and connecting the assembly portion consisting of the pair of electrode pads 51, 51 arranged on the assembly object 5 and the joint portions 31, 31 of the electrode plates 3, 3 by the solder or the like can be performed easily.

Second Embodiment

Figure 9:
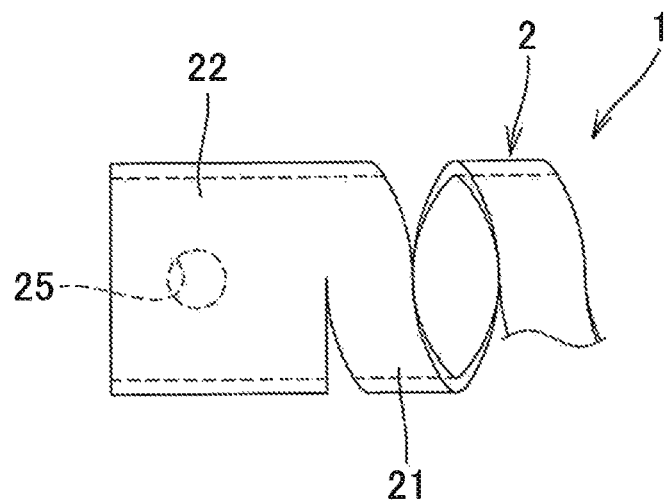
FIG. 9 is a plan view showing a second embodiment of the coiled electronic component according to one aspect of the present invention.
Figure 10:
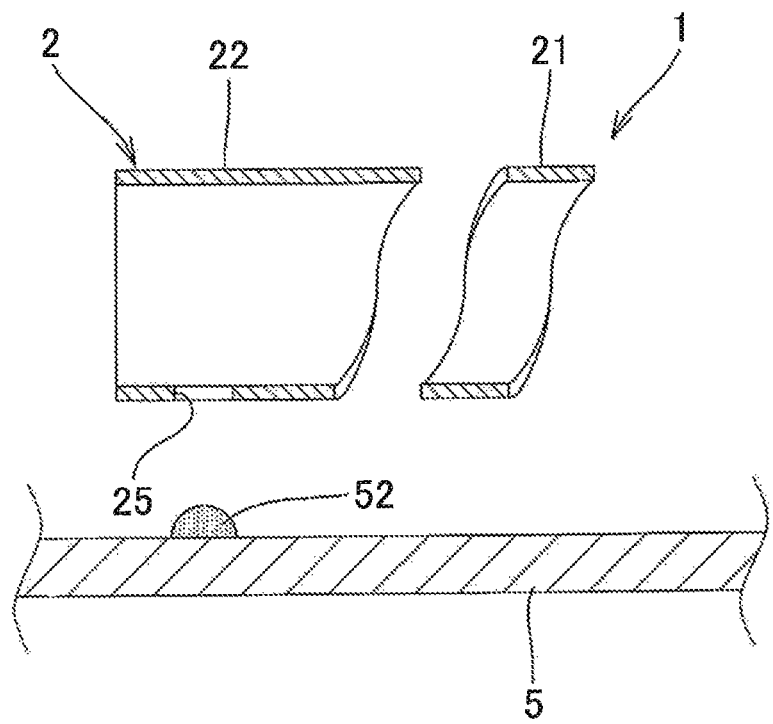
FIG. 10 is a front cross-section view showing a specific structure of the coiled electronic component of the second embodiment.
Figure 11:
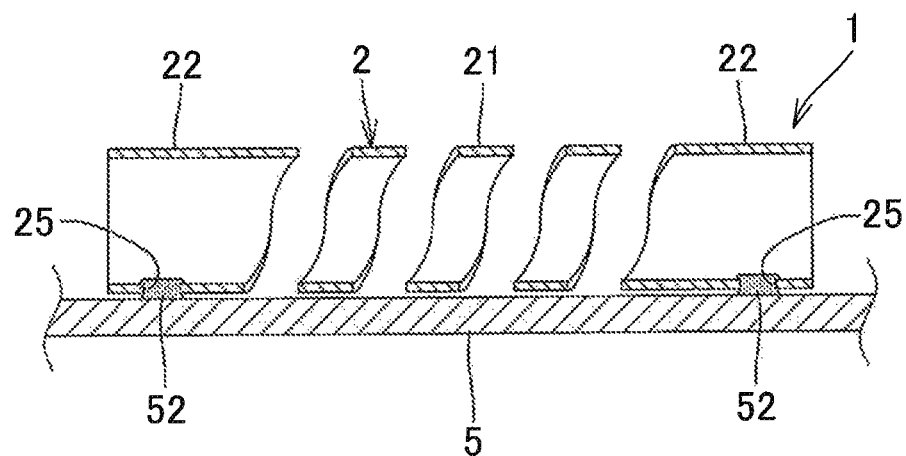
FIG. 11 is a front cross-section view showing a state in which the coiled electronic component of the second embodiment is assembled to the assembly object.

FIG. 9 and FIG. 10 are a plan view and a front cross-section view showing a second embodiment of the coiled electronic component 1; and FIG. 11 is a side cross-section view showing a state in which the coiled electronic component 1 is assembled to the assembly object 5.

Similar to the first embodiment, the coiled electronic component 1 of the second embodiment includes an electronic component body 2 which includes a coil portion 21 having a spiral structure and formed of an electrically conductive material and electrically conductive connection portions 22 arranged on both ends of the coil portion 21. Then, the coiled electronic component 1 of the second embodiment is different from the first embodiment in that circular opening portions 25 which are externally fitted into positioning fixed portions 52 consisting of a ball-shaped solder material and arranged on the assembly object 5 are respectively formed on the electrically conductive connection portions 22, 22 of the electronic component body 2.

In order to assemble the coiled electronic component 1 of the second embodiment to the assembly object 5, the electronic component body 2 is set in a state that the opening portion 25 of the electrically conductive connection portion 22 and the positioning fixed portion 52 arranged on the assembly object 5 are aligned and the opening portion 25 is externally fitted into the positioning fixed portion 52 by mounting the electronic component body 2 on the assembly object 5. Next, by heating the positioning fixed portion 52 to a prescribed temperature to melt the ball-shaped solder material, as shown in FIG. 11, the opening portion 25 of the electrically conductive connection portion 22 is soldered in a state of being aligned to the assembly position of the assembly object 5.

According to the coiled electronic component 1 which includes, as described above, the coil portion 21 having a spiral structure and formed of an electrically conductive material and the electrically conductive connection portions 22, 22 arranged on both ends of the coil portion 21, and in which the opening portion 25 corresponding to the positioning fixed portion 52 arranged on the assembly object 5 is formed in the electrically conductive connection portion 22, the opening portion 25 of the electrically conductive connection portion 22 can be easily assembled to the positioning fixed portion 52 of the assembly object 5 by soldering and the like. Therefore, there is an advantage that generation of a contact failure in the coiled electronic component 1 can be suppressed and the manufacturing cost can be kept low even when an extremely small coiled electronic component 1 is formed.

Figure 12:
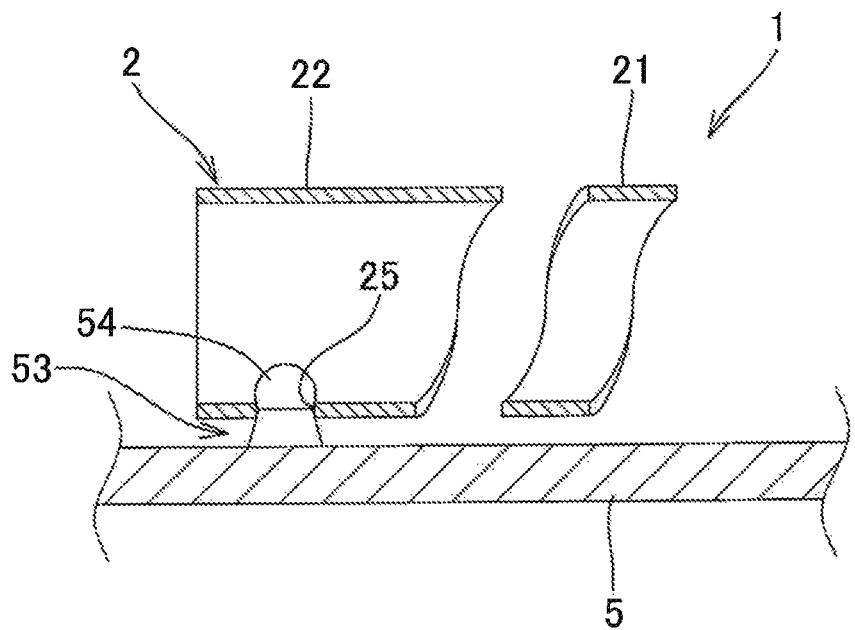
FIG. 12 is a front cross-section view showing a first variant of the coiled electronic component of the second embodiment.
Figure 13:
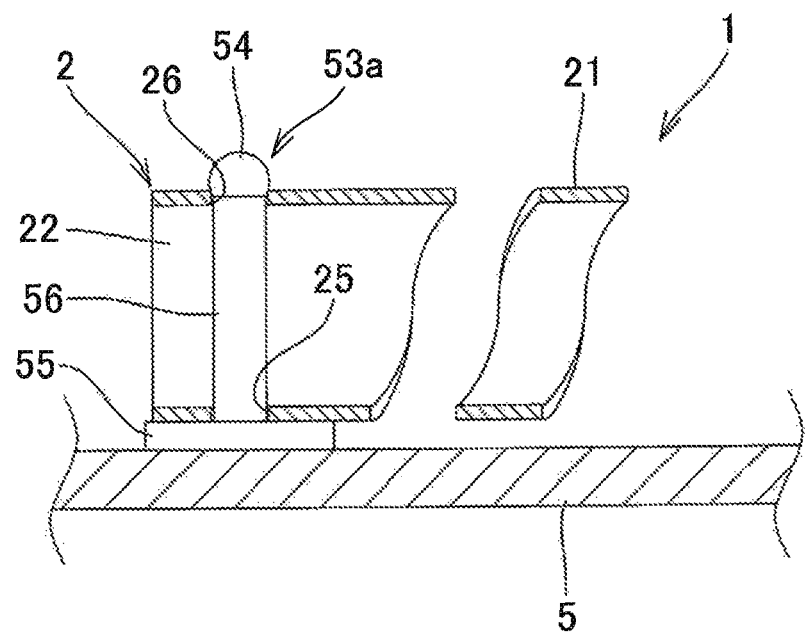
FIG. 13 is a front cross-section view showing a second variant of the coiled electronic component of the second embodiment.
Figure 14:
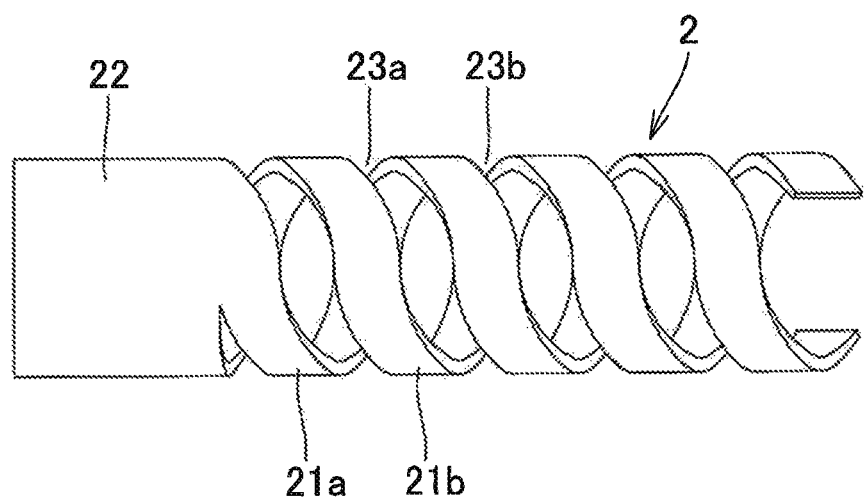
FIG. 14 is an enlarged view showing a variant of the electronic component body constituting the coiled electronic component.

FIG. 12 is a lateral cross-section view showing a first variant of the coiled electronic component 1 of the second embodiment; FIG. 13 is a lateral cross-section view showing a second variant of the coiled electronic component 1 of the second embodiment; and FIG. 14 is a partially enlarged view showing a variant of the electronic component body 2.

On the assembly object 5 to which the coiled electronic component 1 of the first variant is assembled, as shown in FIG. 12, a positioning fixed portion which is formed of an electrically conductive material and which includes a protrusion 53 having a spherical portion 54 with a large diameter at the top is arranged. In addition, on the lower surface of the electrically conductive connection portion 22 of the electronic component body 2, the opening portion 25 which is slightly smaller in diameter than the spherical portion 54 and a body portion of the protrusion 53 is formed.

In the above-described configuration, in a state that the opening portion 25 of the electrically conductive connection portion 22 and the assembly position of the assembly object 5 are aligned by externally fitting the opening portion 25 of the electrically conductive connection portion 22 to the protrusion 53 of the assembly object 5 and pressing the opening portion 25 downward of the spherical portion 54, a connection state can be obtained in which an inner peripheral surface of the opening portion 25 is pressed against an outer peripheral surface of the protrusion 53.

On the other hand, as shown in FIG. 13, the coiled electronic component 1 of the second variant is different from the first variant in that a pair of upper and lower opening portions 25, 26 are formed on the electrically conductive connection portion 22 of the electronic component body 2. Then, above a protrusion 53a consisting of an electrically conductive material and arranged on the assembly object 5, the spherical portion 54 which is larger in diameter than the upper opening portion 26 is formed; and below the protrusion 53a, a flange portion 55 which is larger in diameter than the lower opening portion 25 is formed. In addition, between the spherical portion 54 and the flange portion 55, a columnar body portion 56 which is smaller in diameter than the opening portions 25, 26 and has a length corresponding to the outer diameter of the electrically conductive connection portion 22 is arranged.

In the above-described configuration, the opening portions 25, 26 of the electrically conductive connection portion 22 are externally fitted to the protrusion 53a of the assembly object 5 and is pressed downward of the spherical portion 54, and thereby a connection state can be obtained in which the inner peripheral surfaces of the two opening portions 25, 26 are respectively pressed against the outer peripheral surface of the protrusion 53a, and the lower surface of the electrically conductive connection portion 22 is pressed against the upper surface of the flange portion 55. In addition, in the assembled state of the coiled electronic component 1, the spherical portion 54 having a large diameter projects upward of the electrically conductive connection portion 22, and thus a confirmation on whether or not the opening portion 25 of the electrically conductive connection portion 22 and the protrusion 53a of the assembly object 5 are connected well can be easily performed by visually checking the projecting of the spherical portion 54.

Besides, in the above embodiment, an example is described in which one slit 23 which extends spirally from one end toward the other end of the tubular body consisting of a material having electrical conductivity is formed along the peripheral surface of the tubular body and thereby the coil portion 21 of the electronic component body 2 is formed, but as shown in FIG. 14, a pair of slits 23a, 23b which extends spirally from the electrically conductive connection portion 22 arranged on one end side of the electronic component body 2 toward the other end side may be formed along the peripheral surface of the tubular body and thereby a pair of coil portions 21a, 21b which extends in parallel at a fixed interval is arranged in the electronic component body 2.

That is, the coiled electronic component according to one aspect of the present invention includes: an electronic component body which includes a coil portion having a spiral structure and formed of an electrically conductive material and electrically conductive connection portions arranged on both ends of the coil portion; and a pair of electrodes for respectively connecting the electrically conductive connection portions to assembly portions arranged on an assembly object; wherein the electrode has a pair of pinching pieces for pinching the electrically conductive connection portion, and the pair of pinching pieces is opened in a manner that the electrically conductive connection portion is received and fitted therebetween.

According to the configuration, by fitting the electrically conductive connection portions arranged on both ends of the electronic component body between the pinching pieces of the electrodes, the inside surfaces of the pinching pieces can be respectively brought into contact with the peripheral surfaces of the cylindrical electrically conductive connection portions for a connection, and thus there is little concern that a contact failure between the conductor portions is generated frequently, and there is an advantage that the coiled electronic component can be formed in an extremely simple way.

In addition, preferably, in the pair of pinching pieces, the projection portions projecting inward the inside of the opening are arranged in sections on the upstream side in the fitting direction of the electrically conductive connection portion.

According to the configuration, by pressing the electrically conductive connection portion of the electronic component body from the upstream side in the fitting direction to the projection portions to make the two pinching pieces deform elastically, the electrically conductive connection portion can be smoothly fitted to the downstream side in the fitting direction of the projection portion. Moreover, there is an advantage that the movement of the electrically conductive connection portion is restricted by the projection portions of the pinching pieces in a state that the electrically conductive connection portion is fitted to the downstream side of the projection portions and pinched by the two pinching pieces, and the falling off of the electrically conductive connection portion can be effectively prevented.

In addition, slits into which the inner edge portions of the pair of pinching pieces are inserted may be formed in the electrically conductive connection portion.

According to the configuration, in a state that the inner edge portions of the pinching pieces and the slits are engaged, the electrically conductive connection portion is made to slide and displace along the pair of pinching pieces, and thereby the electrically conductive connection portion can be moved smoothly to the pinching position. Then, there is an advantage that the connection state of the electrically conductive connection portion and the electrode can be stably maintained and the electronic component body can be reliably prevented from falling off from the electrode by pinching the electrically conductive connection portion of the electronic component body between the two pinching pieces.

In addition, a coupling member which includes an electrically non-conductive member and which couples the pair of electrodes to each other may be included.

According to the configuration, the electrically conductive connection portion of the electronic component body is inserted and held between the pinching pieces of the electrode, and thereby a chip-type electronic component in which the electronic component body, the electrodes, and the coupling member are integrated can be formed, and the work of mounting and assembling the electronic component on the assembly object or the like can be easily performed.

In addition, the coiled electronic component according to one aspect of the present invention includes: a coil portion having a spiral structure and formed of an electrically conductive material, and electrically conductive connection portions arranged on both ends of the coil portion; and opening portions corresponding to positioning fixed portions arranged on an assembly object are formed in the electrically conductive connection portion.

According to the configuration, the opening portions of the electrically conductive connection portions and the positioning fixed portions arranged on the assembly object can be more easily connected by soldering or the like in a state of being aligned properly, and thus there is an advantage that generation of a contact failure in the coiled electronic component can be suppressed and the manufacturing cost can be kept low even when an extremely small coiled electronic component is formed.

According to the coiled electronic component having this configuration, the generation of a contact failure can be suppressed, and the manufacturing cost can be kept low.

Third Embodiment

Figure 15:
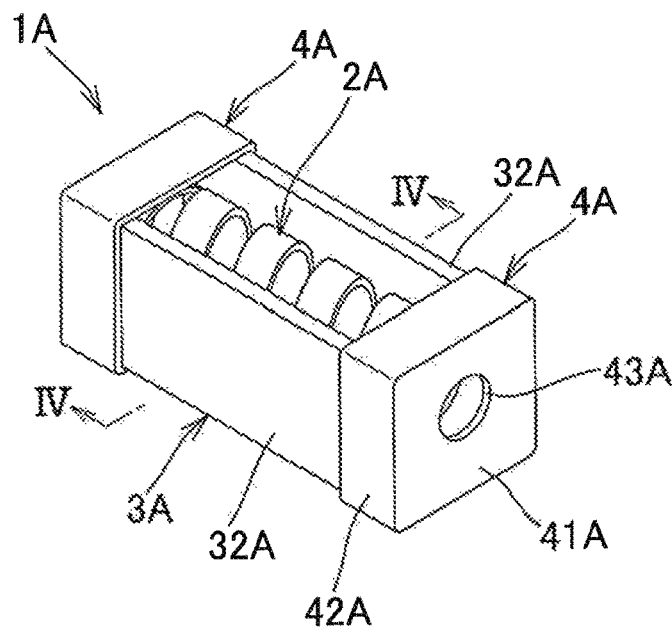
FIG. 15 is a perspective view schematically showing a configuration of a coil component of a third embodiment of the present invention.
Figure 16:
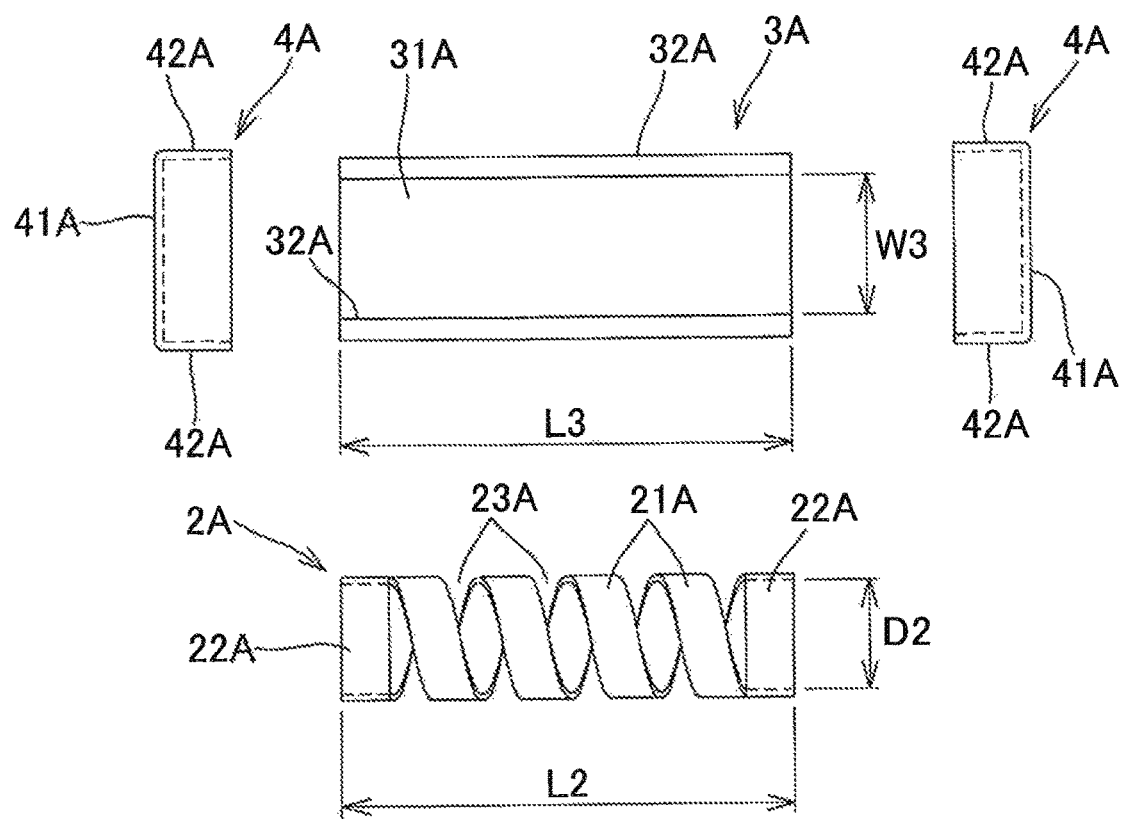
FIG. 16 is a plan view showing a disassembled state of the coil component.
Figure 17:
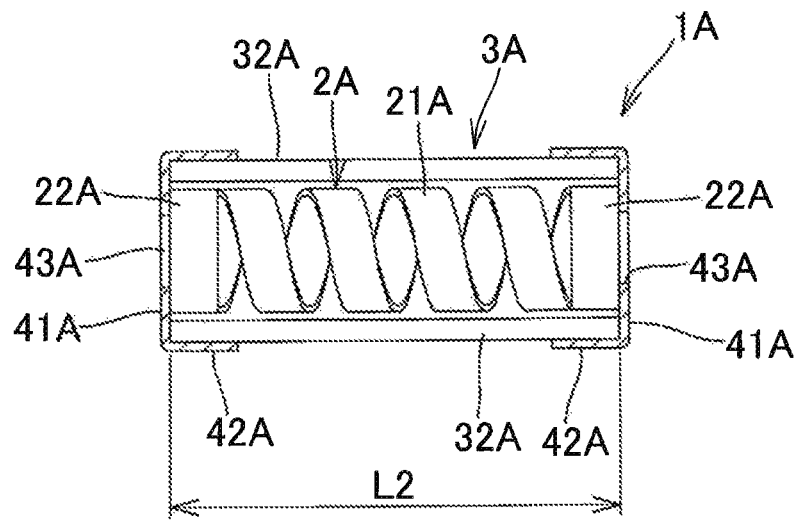
FIG. 17 is a plan cross-section view of a specific structure of the coil component.
Figure 18:
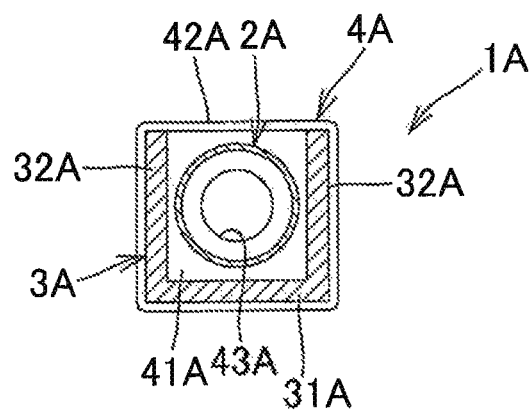
FIG. 18 is a cross-section view along a IV-IV line of FIG. 15 showing the specific structure of the coil component.
Figure 19:
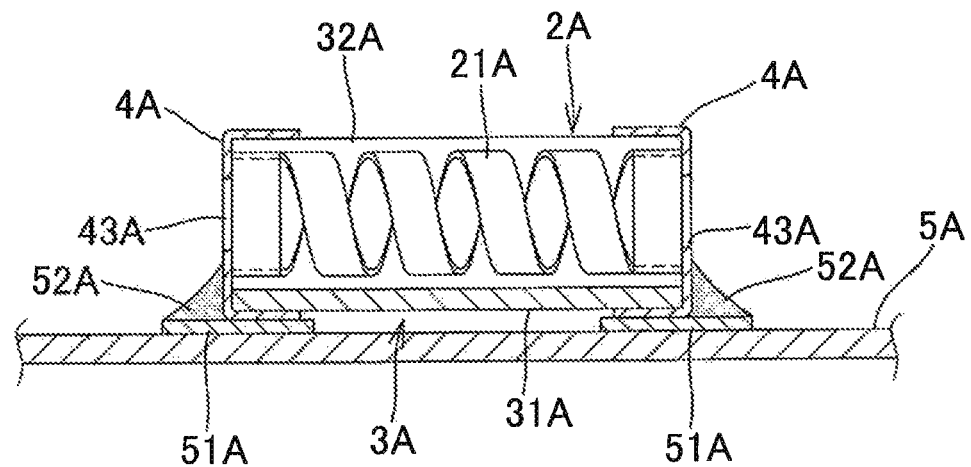
FIG. 19 is a front cross-section view showing a state in which the coil component is loaded on a substrate.
Figure 20:
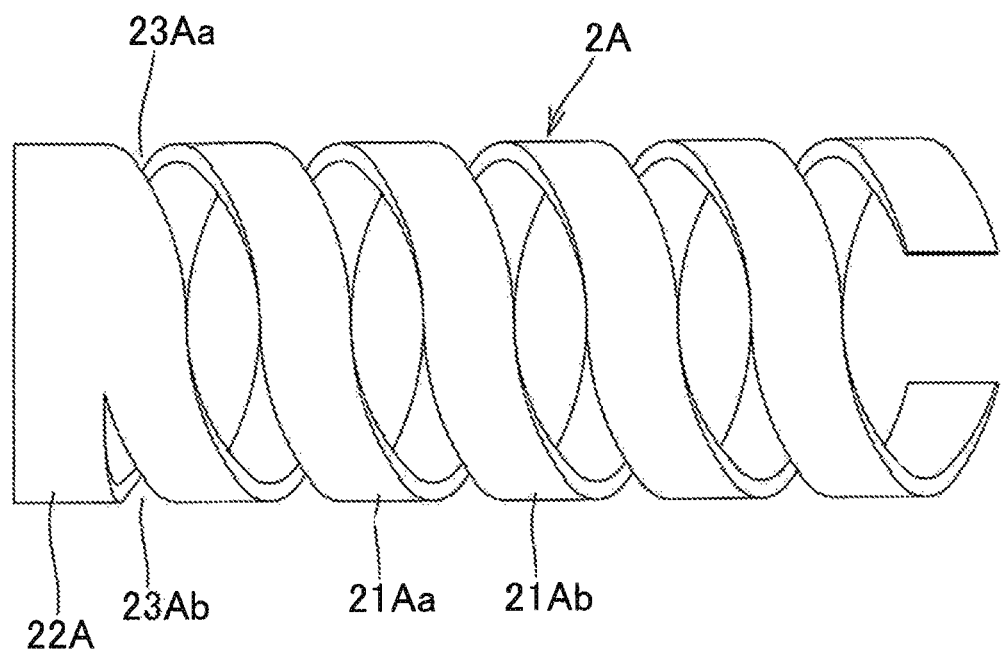
FIG. 20 is an enlarged view showing a variant of the electronic component body constituting the coil component.
Figure 21:
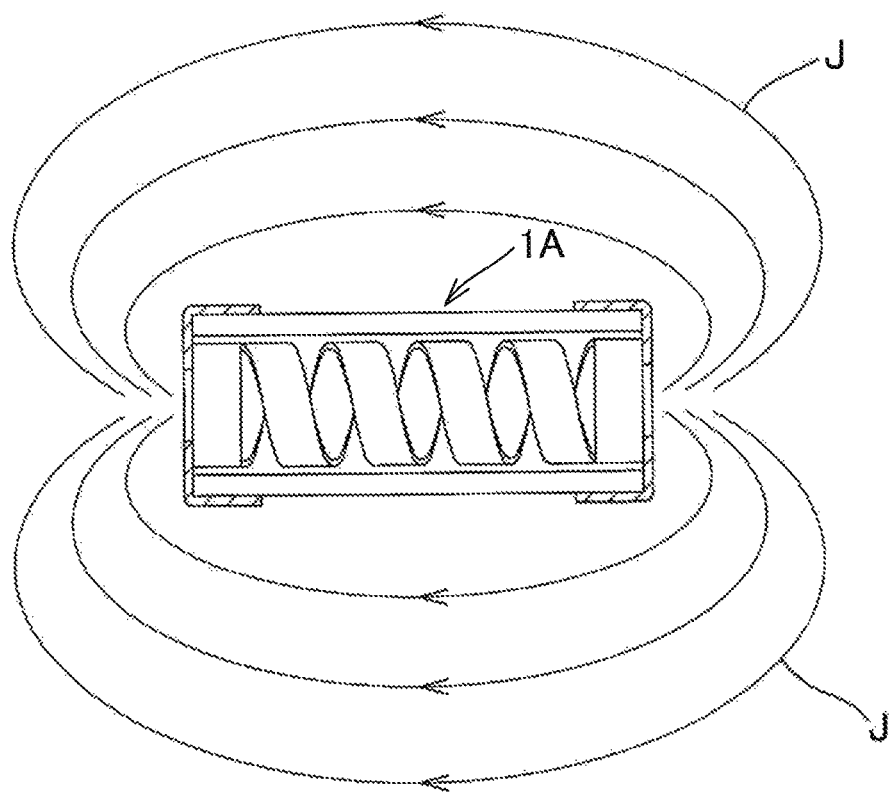
FIG. 21 is a plan cross-section view showing a state of a magnetic flux generated when the coil component is energized.

Embodiments of a coil component 1A according to an aspect of the present invention are described below based on the drawings. Besides, configurations denoted by the same reference numeral in each diagram are the same configurations, and the specific description thereof is omitted. FIG. 15 is a perspective view schematically showing a configuration of the coil component 1A according to one aspect of the present invention. FIG. 16 is a plan view showing a state in which the coil component 1A is disassembled into each configuration component; FIG. 17 is a plan cross-section view of a specific structure of the coil component 1A; FIG. 18 is a cross-section view along a IV-IV line of FIG. 15 showing the specific structure of the coil component 1A; FIG. 19 is a front cross-section view showing a state in which the coil component 1A is loaded on an assembly object 5A; FIG. 20 is an partially enlarged view showing a variant of an electronic component body 2A constituting the coil component 1A; and FIG. 21 is a plan cross-section view showing a state of a magnetic flux J generated when the coil component 1A is energized.

The coil component 1A includes: an electronic component body 2A which consists of a material of nickel or nickel alloy having electrical conductivity; an accommodation case 3A which consists of an electrically non-conductive material and which accommodates the electronic component body 2A; and a pair of electrodes 4A, 4A which are connected to both ends of the electronic component body 2A. The coil component 1A is a chip-type electronic component having the shape of a so-called chip component.

The electronic component body 2A consists of a tubular body having a diameter of about 50 μm-500 μm. The coil portion 21A having a spiral structure is formed in a central portion of the electronic component body 2A by, for example, a length of about 0.5-1.0 mm, and cylindrical electrical connection portions 22A are arranged on both ends of the electronic component body 2A. Besides, a plating layer such as a gold plating or the like may be arranged on an inner peripheral surface of the electronic component body 2A and an insulating coating layer may be arranged on an outer peripheral portion of the electronic component body 2A.

In a fabrication process of the electronic component body 2A, for example, the following method is adopted in which after a tubular body which consists of a material having electrical conductivity is formed, a slit 23A which extends spirally from one end toward the other end of the tubular body is formed along the peripheral surface of the tubular body, and thereby the coil portion 21A having a spiral structure partitioned via the slit 23A is formed in a prescribed region of the electronic component body 2A.

In addition, as long as an etching method, a formative processing method using a laser processing machine or the like is adopted as a forming method of the slit 23A, the coil portion 21A can be easily and properly fabricated on the extremely small electronic component body 2A, and thus the mass production thereof can be achieved. Besides, instead of the embodiment in which the slit 23A is formed after the tubular body is formed, the coil portion 21A and the slit 23A may be formed at the same time by an electroforming method or a fabrication method using a three-dimensional metal printer. In addition, the cross-sectional shape of the electronic component body 2A is not limited to the circular shape and can be various shapes such as a square shape, a hexagon shape or the like.

In a fabrication process of the accommodation case 3A, the accommodation case 3A which has a U-shaped cross section having a bottom wall portion 31A and a pair of left and right side wall portions 32A, 32A and in which the upper surface and both end surfaces are respectively opened is formed by an electrically non-conductive material such as a ceramic material, a plastic material or the like. A total length L3 of the accommodation case 3A is formed to a value smaller than a total length L2 of the electronic component body 2A. In addition, an installation interval W3 of the two side wall portions 32A, 32A is set to a value larger than a diameter D2 of the electronic component body 2A, and thereby the electronic component body 2A can be accommodated in the accommodation case 3A (see FIG. 16).

Electrodes 4A have end plates 41A which cover opening portions formed on the end surfaces of the accommodation case 3A, and peripheral walls 42A externally fitted into the ends of the accommodation case 3A. In addition, in the electrodes 4A, through holes 43A consisting of round holes and the like for passing the magnetic flux J (see FIG. 21)

generated when the electronic component body 2A is energized are formed substantially at the center of the end plates 41A. Furthermore, the installation interval of the two electrodes 4A, 4A, specifically, an installation interval of the inner wall surfaces of the end plates 41A is set to be equal to the total length L3 of the accommodation case 3A, thereby being set to a value smaller than the total length L2 of the electronic component body 2A.

In a fabrication process of the electrodes 4A, for example, the electrodes 4A including the end plates 41A and the peripheral walls 42A are formed by folding a plate material consisting of a material having electrical conductivity, such as copper, nickel or silver or the like. Then, in an arrangement process of the electrodes 4A, the peripheral walls 42A of the electrodes 4A are externally fitted into the ends of the accommodation case 3A, and thereby the end surfaces of the accommodation case 3A are covered by the end plates 41A of the electrodes 4A.

Besides, the electrodes 4A can also be formed by applying an electrically conductive paste formed by adding glass frit to metal powder to the ends of the accommodation case 3A and then heating the electrically conductive paste to a prescribed temperature for baking. According to this method, the fabrication of the electrodes 4A and the arrangement of the electrodes 4A can be performed at the same time.

After the electrodes 4A are respectively arranged on both ends of the accommodation case 3A in this way, in a connection process of the electronic component body 2A and the electrodes 4A, the electronic component body 2A is inserted from the upper opening portion of the accommodation case 3A into the accommodation case 3A, and thereby the end surfaces of the electrical connection portions 22A arranged on both ends of the electronic component body 2A can be respectively pressed against the end plates 41A of the electrodes 4A to electrically connect the end surfaces of the electrical connection portions 22A and the end plates 41A.

That is, in the above embodiment, the installation interval (L3) of the two electrodes 4A, 4A is set shorter than the total length L2 of the electronic component body 2A. Therefore, if the electronic component body 2A is accommodated into the accommodation case 3A in a state of being compressed and deformed, as shown in FIG. 17, the electrical connection portions 22A are pressed against the end plates 41A of the electrodes 4A corresponding to a restoring force of the electronic component body 2A, and thereby both ends of the electronic component body 2A are respectively electrically connected to the two electrodes 4A.

According to the manufacturing method of the coil component 1A which, as described above, includes the fabrication process of the electronic component body 2A for fabricating the electronic component body 2A which includes the coil portion 21A having a spiral structure and formed of a material having electrical conductivity; the fabrication process of the accommodation case 3A for fabricating the accommodation case 3A which consists of an electrically non-conductive material and accommodates the electronic component body 2A; the arrangement process of the electrodes 4A for respectively arranging the electrodes 4A on both ends of the electronic component body 2A; and the connection process of the electronic component body 2A and the electrodes 4A for respectively bringing both ends of the electronic component body 2A into contact with the electrodes 4A for a connection, after the electrodes 4A are respectively attached to both ends of the accommodation case 3A in the arrangement process of the electrodes 4A, the electronic component body 2A is inserted from the upper opening portion of the accommodation case 3A in the connection process, and thereby the end surfaces of the electrical connection portions 22A arranged on both ends of the electronic component body 2A can be respectively pressed against and electrically connected to the end plates 41A of the electrodes 4A.

Then, as shown in FIG. 19, the electrodes 4A, 4A arranged on both ends of the accommodation case 3A are mounted on the assembly object 5A which includes a printed wiring board, a flexible board, a ceramic multilayer wiring board, an electrode plate for liquid-crystal display or plasma display, a semiconductor substrate and the like, and the pair of electrode pads 51A, 51A arranged on the assembly object 5A and the bottom surface portions of the electrodes 4A, 4A are connected by the solder 52A and the like, and thereby the coil component 1A having the electronic component body 2A in which the coil portion 21A having a spiral structure is formed can be used as an inductance element, a T-type filter, an oscillation circuit or the like.

Accordingly, the coil component 1A according to one aspect of the present invention includes the electronic component body 2A which includes the coil portion 21A having a spiral structure and formed of a material having electrical conductivity, the accommodation case 3A which consists of an electrically non-conductive material and accommodates the electronic component body 2A, and the pair of electrodes 4A, 4A connected to both ends of the electronic component body 2A, and the electrodes 4A are arranged on both ends of the accommodation case 3A; and thus there is an advantage that generation of a contact failure in the coil component 1A can be suppressed and the manufacturing cost can be kept low even when an extremely small coil component 1A is formed.

That is, the electronic component body 2A is accommodated into the accommodation case 3A consisting of an electrically non-conductive material, and thereby the cylindrical electrical connection portion 22A arranged on both ends of the electronic component body 2A are respectively brought into contact with and connected to the electrodes 4A arranged on both ends of the accommodation case 3A. As a result, compared with a case that, as shown in the conventional technology shown in patent literature 1, plural pieces of thin ceramic plates in which circular conductor portions are formed are laminated and the conductor portions of each ceramic plate are connected to each other by external electrodes formed on both ends of a chip coil body including a laminate of the ceramic plates, in the coiled component 1A, there is little concern that a contact failure between the conductor portions is frequently generated, and the coiled component 1A can be formed in an extremely simple way.

Moreover, since the electronic component body 2A can be accommodated into the accommodation case 3A and be protected, even in an extremely small coil component 1A in which the total length and the diameter of the electronic component body 2A are set extremely small, a damage thereof can be prevented and the coil component 1A can be easily and properly mounted on the assembly object 5A including a substrate and the like.

In addition, in the above embodiment, after a tubular body consisting of a material having electrical conductivity is formed in the fabrication process of the electronic component body 2A, the slit 23A which extends spirally from one end toward the other end of the tubular body is formed along the peripheral surface of the tubular body, and thereby the coil portion 21A having a spiral structure is formed in the electronic component body 2A, and thus by an etching method, a formative processing method using a laser processing machine, or the like, the extremely small electronic component body 2A as described below can be easily and properly fabricated and the mass production thereof can be achieved.

For example, the total length of the coil portion 21A which is arranged on the electronic component body 2A is set to 0.5 mm-1.0 mm, the diameter D2 of the coil portion 21A is set to 50 µm-500 µm, and the number of turns of the coil portion 21A is selected appropriately, and thereby the inductance element having an inductance of about 30 pH-100 pH can be easily and properly fabricated.

In addition, as described above, according to the structure in which both side ends of the accommodation case 3A are respectively formed into an opened shape and the electrodes 4A are arranged to cover the openings of the accommodation case 3A, the electronic component body 2A is accommodated into the accommodation case 3A and both ends of the electronic component body 2A are brought into contact with the electrodes 4A, and thereby the electrical connection between the electronic component body 2A and the electrodes 4A can be easily and properly performed.

Particularly, as described above, when the installation interval (L3) of the electrodes 4A, 4A arranged on both ends of the accommodation case 3A is set shorter than the total length L2 of the electronic component body 2A, there is an advantage that both ends of the electronic component body 2A are pressed against the end plates 41A of the electrodes 4A corresponding to the restoring force of the electronic component body 2A merely by extremely simple work of compressing and deforming the electronic component body 2A to accommodate the electronic component body 2A into the accommodation case 3A, and thereby a stable electrical connection state can be obtained.

Besides, instead of or along with the configuration in which both ends of the electronic component body 2A are pressed against the end plates 41A of the electrodes 4A corresponding to the restoring force of the electronic component body 2A, in the connection process of the electronic component body 2A and the electrodes 4A, the ends of the electronic component body 2A accommodated in the accommodation case 3A may be soldered or adhered by an electrically conductive adhesive to the electrodes 4A, thereby respectively connecting both ends of the electronic component body 2A to the electrodes 4A, 4A.

In addition, the cylindrical electrical connection portions 22A arranged on both ends of the electronic component body 2A may be omitted, and the coil portion 21A having a spiral structure may be formed over the total length of the electronic component body 2A. In this case, the ends of the electronic component body 2A can be electrically connected to the electrodes 4A by pressing the ends of the coil portion 21A against the end plates 41A of the electrodes 4A corresponding to the restoring force of the electronic component body 2A, or soldering the ends of the coil portion 21A and the electrodes 4A or the like.

In addition, an example is described in which one slit 23A extending spirally from one end toward the other end of the tubular body consisting of a material having electrical conductivity is formed along the peripheral surface of the tubular body and thereby the coil portion 21A of the electronic component body 2A is formed, but as shown in FIG. 20, a pair of slits 23Aa, 23Ab which extends spirally from the electrical connection portion 22A arranged on one end side of the electronic component body 2A toward the other end side may be formed along the peripheral surface of the tubular body, thereby arranging a pair of coil portions 21Aa, 21Ab which extends in parallel at a certain interval on the electronic component body 2A.

Furthermore, the coil component 1A has a structure in which the through holes 43A for passing the magnetic flux generated when the electronic component body 2A is energized are arranged in the end plates 41A of the electrodes 4A, and thus when the coil component 1A is used as an inductance element or the like, as shown in FIG. 21, a flow of the magnetic flux J generated when the electronic component body 2A is energized can be prevented from being inhibited by the electrodes 4A, and performance of the coil component 1A can be displayed well.

Besides, an example is described in which the through holes 43A consisting of round holes and the like are formed in the central portions of the end plates 41A of the electrodes 4A, but the through holes having various shapes consisting of square holes and the like can be formed in arbitrary positions of the electrodes 4A as long as both ends of the electronic component body 2A can be brought into contact with the electrodes 4A and the magnetic flux J can pass.

In addition, the accommodation case 3A is not limited to the U-shaped cross section having the bottom wall portion 31A and the pair of left and right side wall portions 32A, 32A. The accommodation case may also be formed in a cylindrical body having a circular cross section or a square tube body having a square cross section which consists of an electrically non-conductive material such as a ceramic material, a plastic material or the like, and the electrodes 4A may be arranged on both ends of the accommodation case after the electronic component body 2A is inserted from one end of the accommodation case.

Figure 22:
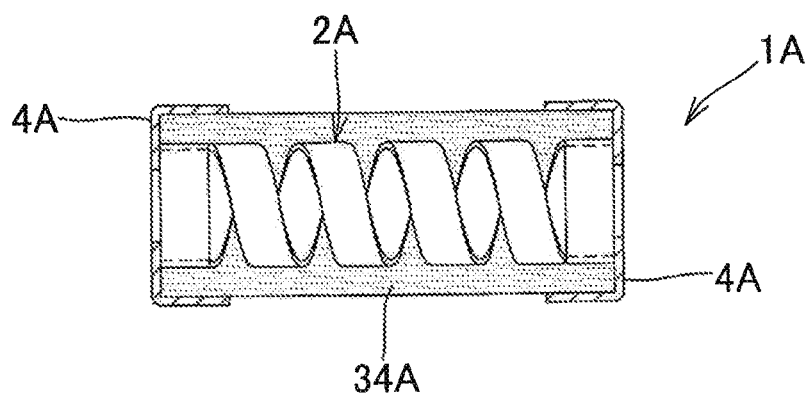
FIG. 22 is a front cross-section view showing another embodiment of the coil component according to one aspect of the present invention.
Figure 23A:
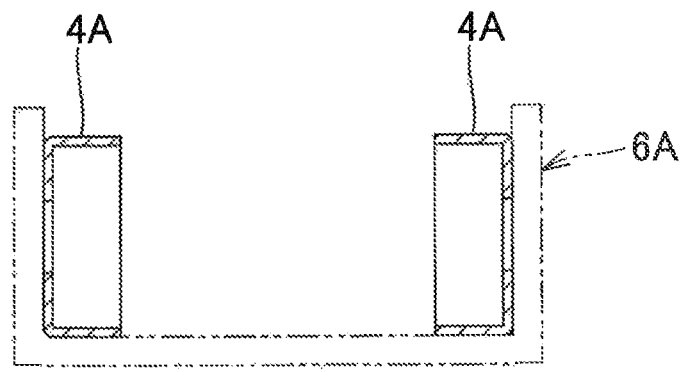
FIG. 23A is a process diagram showing a fabrication process of an accommodation case shown in FIG. 22.
Figure 23B:
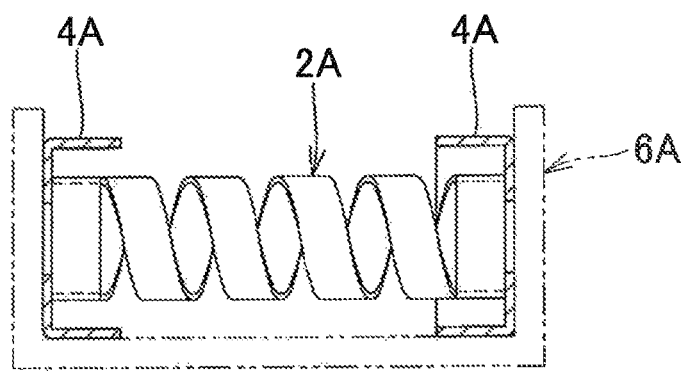
FIG. 23B is a process diagram showing the fabrication process of the accommodation case shown in FIG. 22.

FIG. 22 is a cross-section view showing another embodiment of the coil component 1A according to one aspect of the present invention; and FIG. 23A, FIG. 23B are process diagrams showing a fabrication process of an accommodation case 34A of this embodiment.

In order to fabricate the accommodation case 34A, firstly as shown in FIG. 23A, the pair of electrodes 4A, 4A is set in a fixture 6A at an interval corresponding to the total length of the electronic component body 2A, then as shown in FIG. 23B, the electronic component body 2A is arranged between the two electrodes 4A, 4A. Next, a filler consisting of an electrically non-conductive material such as a silicon resin material or the like is filled between the electrodes 4A, 4A and cured to enclose the outer peripheral portion of the electronic component body 2A. Accordingly, as shown in FIG. 22, the accommodation case 34A which includes a coating layer enclosing the electronic component body 2A is fabricated, and the electronic component body 2A and the electrodes 4A, 4A are joined in a state that the electrodes 4A, 4A are arranged to cover both ends of the electronic component body 2A.

In this case, preferably, a curing expandable material such as a curing expandable resin, a plaster or the like which has the property of expanding during curing is used as the filler constituting the accommodation case 34A. When a filler consisting of the curing expandable material is used to form the accommodation case 34A, there is an advantage that the filler expands during curing in a state of integrally holding the electronic component body 2A and thus both ends of the electronic component body 2A are reliably pressed against the electrodes 4A, 4A which are held by the fixture 6A and the like and the stable electrical connection state is obtained.

In addition, when a material having heat-resisting property is used as the filler constituting the accommodation case 34A, heat deterioration of the electronic component body 2A can be more effectively suppressed by the accommodation case 34A which consists of the material having heat-resisting property even if the coil component 1A is used in a high temperature environment over 200° C. for example.

Figure 24:
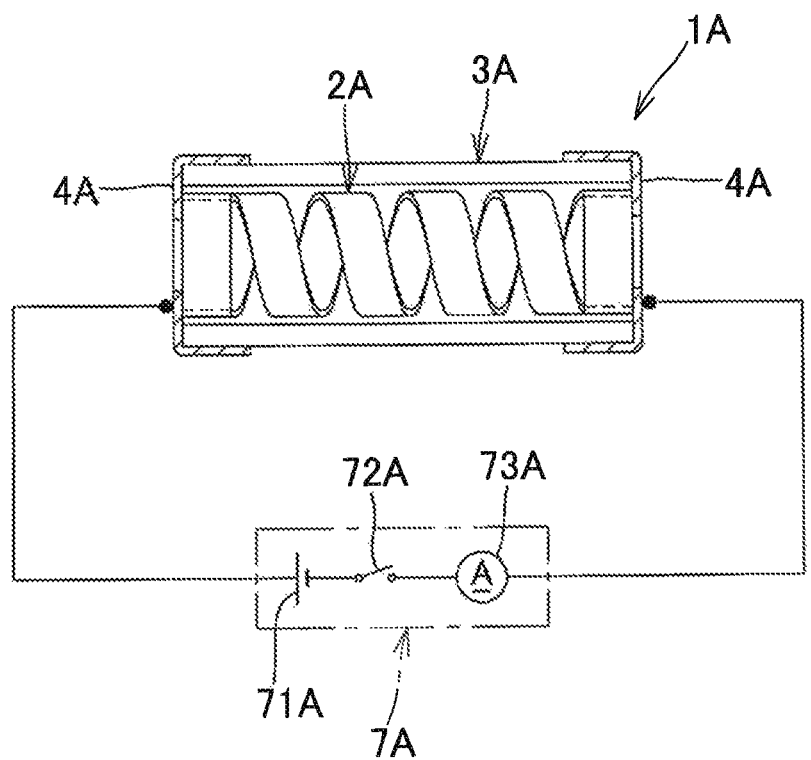
FIG. 24 is an illustration diagram showing a variant of a connection process of the electronic component body and electrodes.

FIG. 24 is an illustration diagram showing a variant of a connection process of both ends of the electronic component body 2A and the electrodes 4A. In the connection process, a welding current of about one ampere is applied from an energization device 7A which has a power supply 71A, an opening and closing switch 72A and an ammeter 73A to the electrodes 4A, 4A and the electronic component body 2A arranged therebetween, and thereby the joining portions of the electrodes 4A, 4A and the electronic component body 2A are heated and welded.

According to the configuration, there is an advantage that both ends of the electronic component body 2A can be welded and connected to the electrodes 4A merely by applying the welding current from the energization device 7A to the electrodes 4A, 4A and the electronic component body 2A arranged therebetween, and a check can be performed at the same time on whether or not the welding of the electrodes 4A, 4A and the electronic component body 2A is properly performed corresponding to a measurement value of the ammeter 73A.

That is, when an inconvenience that the welding current applied from the energization device 7A is blocked due to an intervention of foreign matter between the electronic component body 2A and the electrodes 4A is generated, the measurement value of the ammeter 73A becomes 0, and thus a determination on whether or not the coil component 1A is manufactured properly can be performed according to the current measurement value. Therefore, there is an advantage that a detection on whether or not a defective product is manufactured can be easily and properly performed as long as the ammeter 73A is used to measure the current value during the manufacturing of the coil component 1A.

That is, the coil component according to one aspect of the present invention includes an electronic component body which includes a coil portion having a spiral structure and formed of a material having electrical conductivity, an accommodation case which consists of an electrically non-conductive material and accommodates the electronic component body, and a pair of electrodes which is connected to both ends of the electronic component body; and the pair of electrodes is respectively arranged on both ends of the accommodation case.

According to the configuration, by accommodating the electronic component body which includes the coil portion having a spiral structure into the accommodation case, the ends of the electronic component body can be respectively brought into contact with and connected to the electrodes arranged on both ends of the accommodation case, and the electronic component body can be protected by the accommodation case. Therefore, there is an advantage that a damage of the electronic component body can be effectively prevented, generation of problems such as contact failure and the like can be suppressed, and the manufacturing cost of the coil component can be kept low even in an extremely small coil component in which the total length and the diameter of the electronic component body are set extremely small.

In addition, both ends of the accommodation case may be respectively opened, and the respective electrodes may include end plates which are arranged to cover the openings of the accommodation case.

According to the configuration, the electronic component body is accommodated into the accommodation case and both ends of the electronic component body are respectively brought into contact with the end plates of the electrodes, and thereby the electrical connection between the electronic component body and the electrodes can be easily and properly performed.

Furthermore, preferably, the installation interval of the pair of electrodes is set shorter than the total length of the electronic component body.

According to the configuration, there is an advantage that merely by the extremely simple work of compressing and deforming the electronic component body and accommodating the electronic component body into the accommodation case, both ends of the electronic component body are pressed against the electrodes corresponding to a restoring force of the electronic component body and thereby a stable electrical connection state is obtained.

In addition, preferably, through holes for passing a magnetic flux generated when the electronic component body is energized are formed in the respective electrodes.

According to the configuration, when the electronic component body is used as an inductance element or the like, a flow of the magnetic flux generated when the electronic component body is energized can be prevented from being inhibited by the electrodes, and thus performance of the electronic component body can be displayed well.

A manufacturing method of coil component according to one aspect of the present invention includes: (a) a fabrication process of an electronic component body for fabricating the electronic component body which includes a coil portion having a spiral structure and formed of a material having electrical conductivity; (b) a fabrication process of an accommodation case for fabricating the accommodation case which consists of an electrically non-conductive material and accommodates the electronic component body; (c) an arrangement process of electrodes for respectively arranging the electrodes on both ends of the electronic component body; and (d) a connection process of the electronic component body and the electrodes for respectively bringing both ends of the electronic component body into contact with the electrodes for a connection.

According to the configuration, there is an advantage that by accommodating the electronic component body into the accommodation case in the connection process (d) after the electrodes are respectively attached to both ends of the accommodation case in the arrangement process (c) of the electrodes, both ends of the electronic component body can be respectively pressed against and electrically connected to the electrodes, and the coil component in which the electronic component body is protected by the accommodation case can be easily and properly manufactured.

In addition, in the fabrication process (a) of the electronic component body, desirably, along the peripheral surface of a tubular body consisting of a material having electrical conductivity, the slit which extends spirally from one end toward the other end of the tubular body is formed, and thereby the coil portion of the electronic component body is formed.

According to the configuration, by an etching method, a formative processing method using a laser processing machine, or the like, the coil portion can be easily and properly formed in the extremely small electronic component body, and thus the mass production thereof can be achieved.

In addition, in the fabrication process (b) of the accommodation case, a filler consisting of an electrically non-conductive material may be filled and cured in the outer peripheral portion of the electronic component body after the electronic component body is arranged between the electrodes in a state that the pair of electrodes are disposed oppositely, thereby forming the accommodation case which encloses the electronic component body.

According to the configuration, the filler can hold the electronic component body during curing in a state of integrally holding the electronic component body and thus the electronic component body can be stably held in the accommodation case.

In addition, the electrically non-conductive material is preferably a curing expandable material.

According to the configuration, there is an advantage that both ends of the electronic component body are reliably pressed against the electrodes since the filler expands during curing in a state of integrally holding the electronic component body, and the stable electrical connection state is obtained.

Furthermore, in the connection process (d) of the electronic component body and the electrodes, a welding current may be applied from the electrodes to the electronic component body to respectively weld both ends of the electronic component body to the electrodes.

According to the configuration, there is an advantage that both ends of the electronic component body can be respectively connected to the electrodes merely by applying the welding current to the electronic component body and the electrodes arranged on both ends thereof, and a check on whether or not the welding between the electrodes and the electronic component body is performed properly can be performed by measuring the value of the current for welding.

According to the coil component having this configuration and the manufacturing method thereof, generation of a contact failure in the electronic component can be prevented, and the manufacturing cost can be kept low.

An inductance element, a T-type filter, an oscillation circuit, and a manufacturing method of inductance element are described below.

The present invention relates to an inductance element equipped with a plurality of coils, a T-type filter using the inductance element, an oscillation circuit, and a manufacturing method of the inductance element.

Conventionally, for example, circuits that require coils, such as an oscillation circuit, a tuning circuit, a matching circuit and the like, are widely used in various electronic circuits of a wireless communication device and the like. A frequency handled by the oscillation circuit, the tuning circuit, the matching circuit and the like is affected by a resonance frequency f of a LC circuit. The resonance frequency f is represented by $f=1/[2\pi(LC)^{1/2}]$, wherein L stands for an inductance of coil and C stands for a capacitance of capacitor. In recent years, the frequency handled by a circuit increases, and a circuit having a high resonance frequency f is required. It is necessary to reduce the inductance L so as to increase the resonance frequency f.

In order to produce a coil having a small inductance L, it is necessary to reduce a length or a diameter of the coil. As a manufacturing method of the small coil, the following manufacturing method is known in which a plurality of ceramic plates on which ring-like copper wiring patterns are formed is laminated, and the adjacent ring-like patterns are brought into electrical contact and are conducted by through holes penetrating the ceramic plates (for example, see patent literature 1).

However, in the above-described manufacturing method, it is necessary to position the plurality of ceramic plates with extremely high accuracy, and a failure that the respective ring-like patterns are not conducted is generated when the positioning deviates. In addition, in a chip coil produced by this manufacturing method, it is necessary to laminate the ceramic plates to the number of coil turns, and contact and connection places between the through holes and the ring-like patterns are generated to this number, and thus there is an inconvenience that a contact failure is easily generated between the ring-like patterns. In addition, the chip coil is a single coil, but there is also the need to add components that can be integrated into one component.

The purpose of the present invention is to provide an inductance element, a T-type filter using the inductance element, an oscillation circuit, and a manufacturing method of the inductance element with which it is easy to reduce a risk of generating failures and easy to improve an integration of coils.

An inductance element according to one aspect of the present invention includes: a coil portion which is disposed to constitute a multi-spiral in which a plurality of coils are spaced apart from each other; and a conductive coupling portion which couples and conducts the plurality of coils at one end of the multi-spiral.

The inductance element having this configuration can support, by the conductive coupling portion, the plurality of coils which is disposed to be spaced apart from each other to constitute the multi-spiral. The multi-spiral can also be manufactured even without laminating a plurality of ceramic plates on which ring-like copper wiring patterns are formed as in the manufacturing method described in related art. Accordingly, there is no concern that a contact failure between laminated layers is generated, and thus the risk of generating a contact failure is easily reduced. In addition, the plurality of coils is disposed to constitute the multi-spiral spaced apart from each other, and thus the plurality of coils can be integrated into a single element. Accordingly, the inductance element having this configuration easily improves the integration of coils.

In addition, preferably, the conductive coupling portion has a tubular shape concentric with the multi-spiral.

The inductance element having this shape can be formed by processing a tubular body having a tubular shape and thus can be easily manufactured.

In addition, preferably, the multi-spiral has a shape in which the respective coils are separated by spiral slits along the peripheral surface of the tubular body in which the conductive coupling portion extends in an axial direction.

According to the configuration, the inductance element can be formed by forming a plurality of spiral slits along the peripheral surface of the tubular body, and thus the plurality of coils can be easily formed integrally.

In addition, preferably, the inductance element is a transformer in which one of the plurality of coils is set as a primary coil and at least one of the plurality of coils which is different from the primary coil is set as a secondary coil.

According to the configuration, the plurality of coils constitutes the multi-spiral and thus a mutual inductance is generated between the coils, as a result, by setting one of the plurality of coils as the primary coil and the other coils as the secondary coils, the inductance element can be made to function as a transformer.

In addition, preferably, the length of the coil portion is 0.5 mm-1 mm and the diameter of the coil portion is 50 μm-500 μm.

According to the configuration, a self-inductance of each coil can be set to about 30 pH-100 pH. The coil having this small-value self-inductance can be easily applied to a high frequency circuit.

In addition, a T-type filter according to one aspect of the present invention includes the above-described inductance element and a capacitor, the number of the coils is two, the two coils are connected in series by connecting one terminal of the capacitor to the conductive coupling portion, and one terminal of the capacitor is connected to a connection point of the two coils.

According to the configuration, the T-type filter can be configured by combining the single inductance element and the capacitor, and thus the T-type filter circuit can be easily configured.

In addition, an oscillation circuit according to one aspect of the present invention includes the above-described inductance element and a capacitor, one terminal of the capacitor is connected to one of the plurality of coils, and the other terminal of the capacitor is connected to the conductive coupling portion or a position that is spaced apart by a prescribed distance from the connection place of the one terminal in the one coil.

According to the configuration, the oscillation circuit can be configured by combining the single inductance element and the capacitor, and thus the oscillation circuit is configured easily.

In addition, a manufacturing method of inductance element according to one aspect of the present invention is a manufacturing method of the above-described inductance; along a peripheral surface of an electrically conductive tubular body, a plurality of spiral slits which are spaced apart from each other are formed in a region between one end of the tubular body and a prescribed position spaced apart by a prescribed length from the other end of the tubular body toward the one end direction, and thereby the plurality of spiral coils are formed in the above region and set as the coil portion, and a region from the other end to the prescribed position is set as the conductive coupling portion.

According to the manufacturing method, by forming a plurality of spiral slits along the peripheral surface with respect to the tubular body having electrical conductivity, the plurality of coils can be formed and set as the coil portion, and the region in which the slits are not formed can be set as the conductive coupling portion, and thus the above-described inductance element can be formed easily. In addition, according to this manufacturing method, the entire inductance element can be manufactured as an integral component. Accordingly, it is unnecessary to laminate a plurality of ceramic plates on which ring-like copper wiring patterns are formed as in the manufacturing method described in related art, and thus there is no concern that a contact failure between the laminated layers is generated. Therefore, according to the manufacturing method, the risk of generating a failure of the inductance element is easily reduced.

In addition, the slits are preferably formed by etching or laser processing.

Etching or laser processing is suitable as processing means for forming the spiral slits with respect to the tubular body.

The inductance element having this configuration, the T-type filter using the inductance element, and the oscillation circuit easily reduce the risk of generating a failure and easily improve the integration of coils. In addition, the manufacturing method is suitable for manufacturing the inductance element.

Fourth Embodiment

Figure 25:
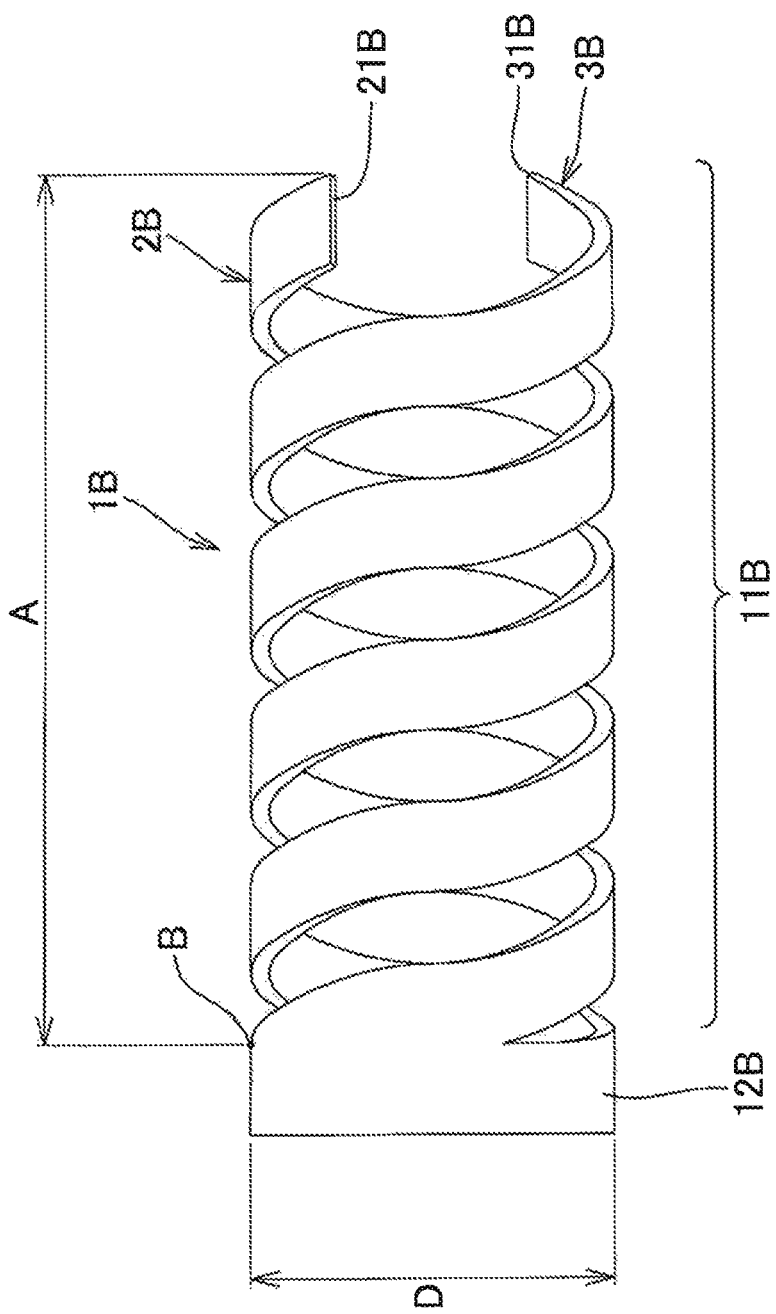
FIG. 25 is a front view showing an appearance of an inductance element of a fourth embodiment of the present invention.

FIG. 25 is a front view showing an appearance of an inductance element of one embodiment of the present invention. An inductance element 1B shown in FIG. 25 includes a coil portion 11B which is disposed to constitute a multi-spiral in which a plurality of coils 2B, 3B are spaced apart from each other, and a tubular portion 12B (a conductive coupling portion) which is concentric with the multi-spiral and which connects and conducts the coils 2B, 3B at one end of the multi-spiral. An example of the inductance element 1B having a double spiral structure in which the number of coils is two is shown.

Besides, although the example of the inductance element 1B including the two coils 2B, 3B and the coil portion 11B constitutes the double spiral is shown in FIG. 25, the number of coils may be three or more, and the coil portion 11B may have a multi-spiral structure with three or more spirals. In addition, an example is shown in which the length and the number of turns of the coil 2B are equivalent to the length and the number of turns of the coil 3B, but the length and the number of turns of the respective coils may be different from each other.

Figure 26:
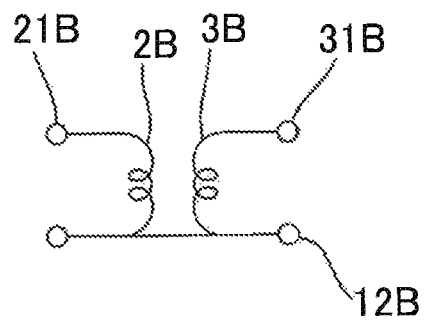
FIG. 26 is a circuit diagram showing an electrical configuration of the inductance element shown in FIG. 25.

FIG. 26 is a circuit diagram showing an electrical configuration of the inductance element 1B shown in FIG. 25. In the inductance element 1B, the end of the coil 2B becomes one terminal 21B of the coil 2B, the end of the coil 3B becomes one terminal 31B of the coil 3B, and the tubular portion 12B becomes a common terminal of the coils 2B, 3B. The coil 2B and the coil 3B are spirally wound to form a double spiral in a manner of being coaxially combined with each other, and thus a magnetic flux penetrates the coil 2B and the coil 3B and thereby a mutual inductance is generated.

Accordingly, the inductance element 1B constitutes a transformer in which one of the coils 2B, 3B is set as the primary coil and the other is set as the secondary coil. In addition, because the inductance element 1B is a single element and can integrate the coils 2B, 3B, the integration of coils is easily improved. In addition, the inductance element 1B is a single element and can constitute the transformer.

Preferably, a length A of the coil portion 11B is 0.5 mm-1 mm, and a diameter D of the coil portion 11B is 50 μm-500 μm. For example, when the length A of the coil portion 11B is set to 1 mm, each number of turns of the coils 2B, 3B is set to 5, and the diameter D of the coil portion 11B is set to 130 μm, the self-inductances of the coils 2B, 3B are respectively 44 pH.

When the capacitor of 1 pF is combined with the inductance of 44 pH to constitute a LC resonant circuit, a resonance frequency f thereof is 24 GHz. When the number of turns of the coils 2B, 3B is set to 3 and the diameter D is adjusted, the coils 2B, 3B can also be combined with the capacitor of 1 pF and the resonance frequency f can be set to 70 GHz.

Next, the manufacturing method of the inductance element 1B is described. When the inductance element 1B is manufactured, firstly, a tubular body being tubular and having electrical conductivity of nickel, nickel alloy or the like is prepared. Next, along the peripheral surface of the tubular body, a plurality of spiral slits which are spaced apart from each other are formed in a region between one end of the tubular body (a right end in the example of FIG. 25) and a prescribed position B spaced apart by a prescribed length from the other end of the tubular body (a left end in the example of FIG. 25) toward the one end direction, and thereby the plurality of spiral coils 2B, 3B are formed in the region and set as the coil portion 11B, and the tubular portion 12B is formed in a region from the other end to the prescribed position B.

As a forming method of the slits, etching or laser processing can be suitably used. Besides, the inductance element 1B is not limited to the example in which the slits are formed in the tubular body having electrical conductivity to form the plurality of coils, for example, electroforming or a three-dimensional printer may also be used to form the inductance element 1B. In addition, the tubular portion 12B having a tubular shape is shown as an example of the conductive coupling portion, but the conductive coupling portion is not limited to the tubular shape as long as the conductive coupling portion couples and conducts the plurality of coils at one end of the multi-spiral.

In regard to the inductance element 1B shown in FIG. 25, the entire inductance element 1B can be manufactured as an integral component by the above-described manufacturing method. Accordingly, it is unnecessary to laminate a plurality of ceramic plates on which ring-like copper wiring patterns are formed to bring the wiring pattern of each layer into contact as in the manufacturing method described in related art, and thus there is no concern that a contact failure between the laminated layers is generated. Therefore, according to the inductance element 1B shown in FIG. 25 and the manufacturing method thereof, the risk of generating a failure of the inductance element 1B is easily reduced.

Fifth Embodiment

Figure 27:
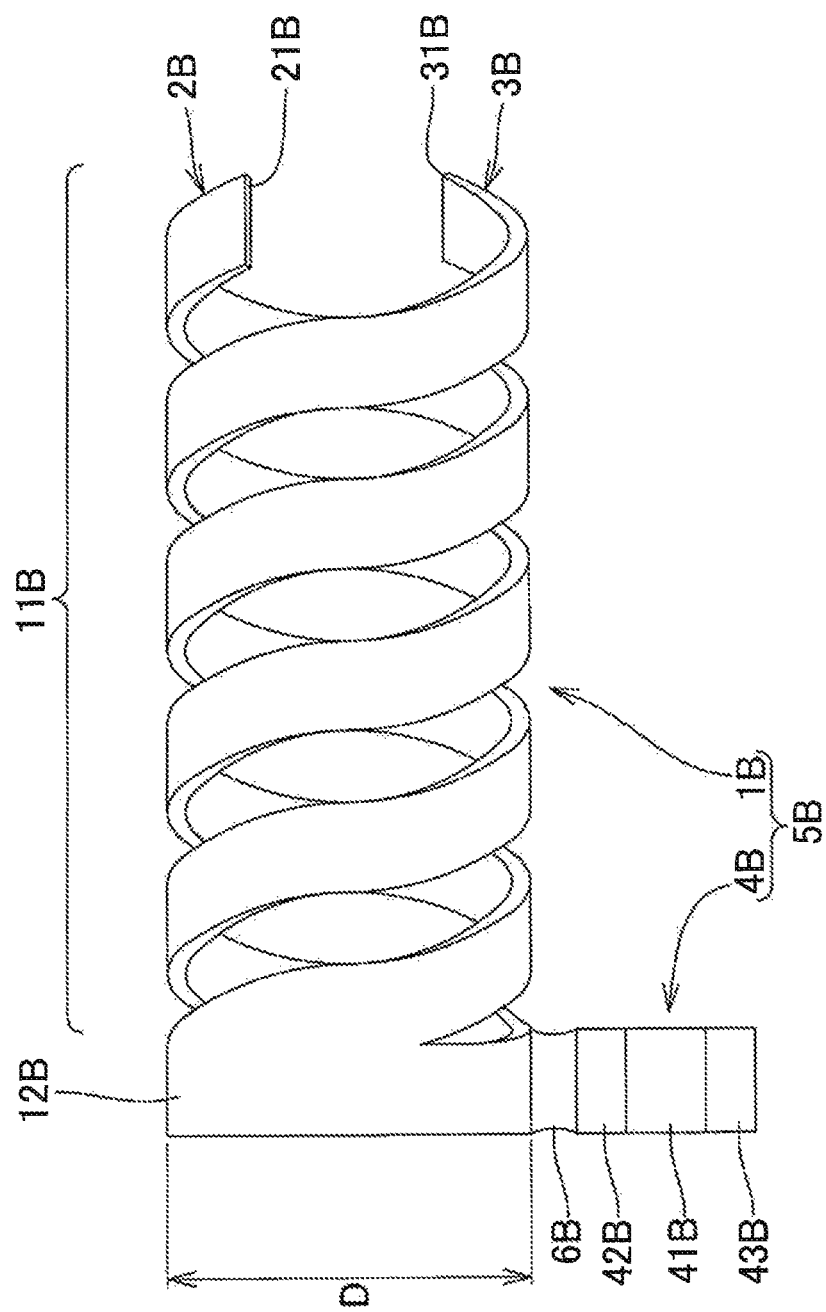
FIG. 27 is a front view showing a configuration example of a T-type filter of a fifth embodiment of the present invention.

Next, a T-type filter of a fifth embodiment of the present invention is described. FIG. 27 is a front view showing a configuration example of the T-type filter of the fifth embodiment of the present invention. A T-type filter 5B shown in FIG. 27 includes the inductance element 1B and a capacitor 4B. The capacitor 4B includes a chip body 41B having a substantially rectangular parallelepiped shape and electrodes 42B, 43B formed on both ends of the chip body 41B. Then, the electrode 42B of the capacitor 4B and the tubular portion 12B are connected by a connection portion 6B.

As connection means of the tubular portion 12B and the electrode 42B using the connection portion 6B, for example, various means such as electrical welding, brazing such as silver brazing or the like, adhesion using an electrically conductive adhesive, soldering and the like can be used. The tubular portion 12B and the electrode 42B are not limited to be connected directly and may be connected by the connection portion 6B which includes a connection member such as a printed wiring board, a bracket or the like.

Figure 28:
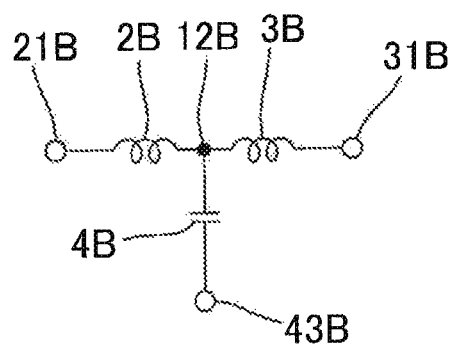
FIG. 28 is a circuit diagram showing an electrical configuration example of the T-type filter shown in FIG. 27.

FIG. 28 is a circuit diagram showing an electrical configuration example of the T-type filter 5B shown in FIG. 27. As shown in FIG. 28, according to the T-type filter 5B shown in FIG. 27, a T-type filter is obtained in which the coils 2B, 3B are connected in series, the electrode 42B of the capacitor 4B is connected to the tubular portion 12B which is a connection point of the coils 2B, 3B, and the electrode 43B of the capacitor 4B constitutes a terminal of the filter.

In this case, the T-type filter 5B can be configured by combining the single inductance element 1B and the capacitor 4B, and thus a T-type filter circuit is configured easily.

Sixth Embodiment

Figure 29:
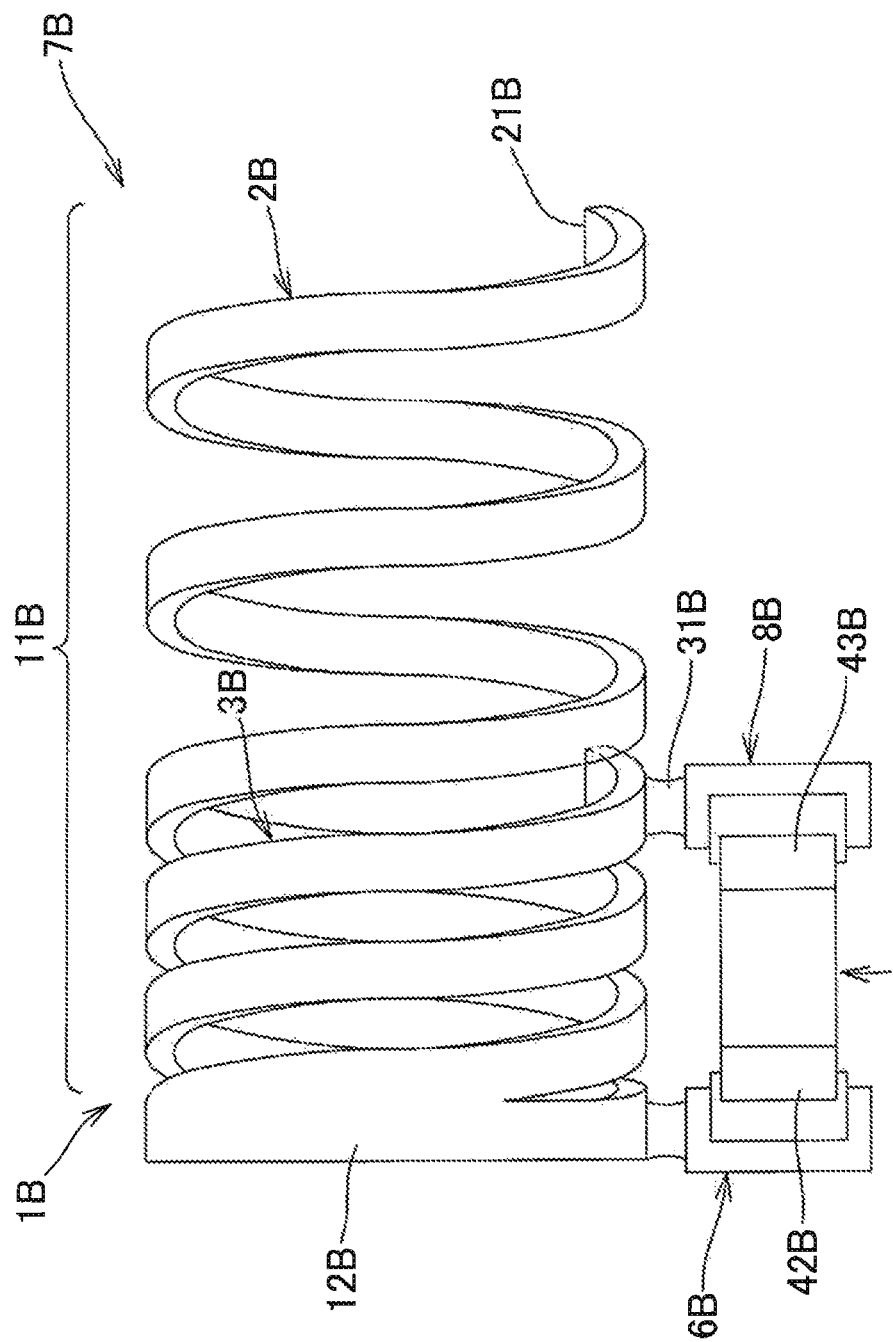
FIG. 29 is a front view showing a configuration example of an oscillation circuit of a sixth embodiment of the present invention.

Next, an oscillation circuit of a sixth embodiment of the present invention is described. FIG. 29 is a front view showing a configuration example of the oscillation circuit of the sixth embodiment of the present invention. An oscillation circuit 7B shown in FIG. 29 includes the inductance element 1B and the capacitor 4B. The inductance element 1B shown in FIG. 29 shows an example in which the number of turns and the length of the coil 3B are shorter than that of the coil 2B. Besides, the electrode 42B of the capacitor 4B and the tubular portion 12B are connected by the connection portion 6B, and the electrode 43B of the capacitor 4B and the terminal 31B of the coil 3B are connected by a connection portion 8B.

Connection means similar to the connection portion 6B can be used as the connection portion 8B. The oscillation circuit 7B shown in FIG. 29 shows an example in which the connection portions 6B, 8B connect the capacitor 4B and the inductance element 1B via a connection member such as a printed wiring board, a fitting or the like.

Figure 30:
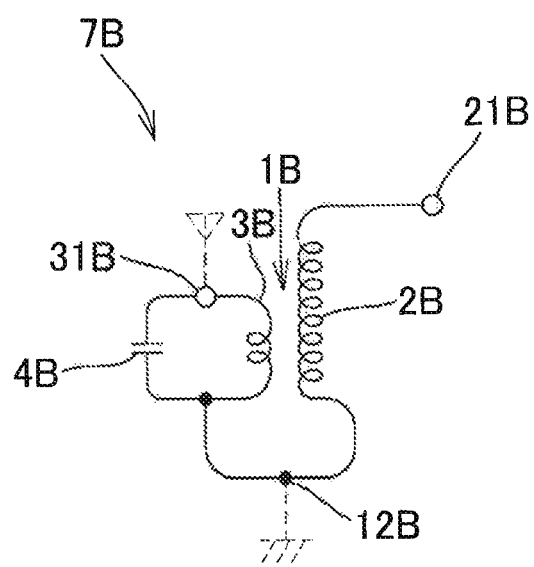
FIG. 30 is a circuit diagram showing an electrical configuration example of the oscillation circuit shown in FIG. 29.

FIG. 30 is a circuit diagram showing an electrical configuration example of the oscillation circuit 7B shown in FIG. 29. As shown in FIG. 30, according to the oscillation circuit 7B shown in FIG. 29, the coil 3B and the capacitor 4B are connected in parallel to constitute a LC resonant circuit, furthermore, the coil 3B and the coil 2B constitute a transformer, and the oscillation circuit is configured as a whole. Furthermore, as shown by dotted lines, a wireless tuning circuit can be configured by connecting the tubular portion 12B to a circuit ground and connecting the terminal 31B to an antenna.

The electrode 43B is not necessarily limited to being connected to the terminal 31B of the coil 3B and may be connected to a central position of the coil 3B. In addition, the electrode 42B is also not necessarily limited to being connected to the tubular portion 12B and may be connected to a position of the coil 3B which is spaced apart by a prescribed distance corresponding to a desired inductance from the connection place of the electrode 43B and the coil 3B.

This application is based on Japanese Patent Application No. 2017-036354, No. 2017-037481, and No. 2017-035642 filed on Feb. 28, 2017, and the contents thereof are included in the application.

Besides, specific embodiments or examples made in the terms of embodiments for implementing the invention merely clarify the technical contents of the present invention, and the present invention should not be limited to the specific examples only and interpreted in a narrow sense.

What is claimed is:

1. A coiled electronic component, comprising: an electronic component body which comprises a coil portion having a spiral structure and formed of an electrically conductive material, and electrically conductive connection portions arranged on both ends of the coil portion; and
a pair of electrodes for respectively connecting the electrically conductive connection portions to assembly portions arranged on an assembly object;
wherein the electrodes include a pair of pinching pieces for pinching the electrically conductive connection portions, and
the pair of pinching pieces is opened in a manner that the electrically conductive connection portions are received and fitted therebetween.

2. The coiled electronic component according to claim 1, wherein in the pair of pinching pieces, projection portions projecting toward the inside of an opening are arranged in a section on an upstream side in the fitting direction of the electrically conductive connection portions.

3. The coiled electronic component according to claim 1, wherein slits into which inner edge portions of the pair of pinching pieces are inserted are formed in the electrically conductive connection portions.

4. The coiled electronic component according to claim 1, comprising a coupling member which consists of an electrically non-conductive member and couples the pair of electrodes with each other.

5. The coiled electronic component according to claim 2, comprising a coupling member which consists of an electrically non-conductive member and couples the pair of electrodes with each other.

6. The coiled electronic component according to claim 3, comprising a coupling member which consists of an electrically non-conductive member and couples the pair of electrodes with each other.

* * * * *